United States Patent [19]

Saitou et al.

[11] Patent Number: 5,162,240
[45] Date of Patent: Nov. 10, 1992

[54] METHOD AND APPARATUS OF FABRICATING ELECTRIC CIRCUIT PATTERN ON THICK AND THIN FILM HYBRID MULTILAYER WIRING SUBSTRATE

[75] Inventors: Norio Saitou, Iruma; Hideo Todokoro, Tokyo; Katsuhiro Kuroda, Hachioji; Satoru Fukuhara, Katsuta; Genya Matsuoka, Ome; Hideo Arima, Yokohama; Hitoshi Yokono, Toride; Takashi Inoue, Yokohama; Hidetaka Shigi, Hadano, all of Japan

[73] Assignee: Hitachi, Ltd., Tokyo, Japan

[21] Appl. No.: 537,492

[22] Filed: Jun. 12, 1990

[30] Foreign Application Priority Data

Jun. 16, 1989 [JP] Japan .................. 1-152339
Sep. 13, 1989 [JP] Japan .................. 1-235650

[51] Int. Cl.⁵ .......................... H01L 21/00
[52] U.S. Cl. .......................... 437/7; 437/8; 437/935; 437/979; 427/96
[58] Field of Search .......... 437/7, 8, 979, 935; 427/96; 148/DIG. 163

[56] References Cited

U.S. PATENT DOCUMENTS

| | | | |
|---|---|---|---|
| 4,408,884 | 10/1983 | Kleinknecht et al. | 437/7 |
| 4,736,521 | 4/1988 | Dohya | 29/830 |
| 4,777,146 | 10/1988 | Bylsna | 437/8 |
| 4,795,512 | 1/1989 | Nakatani | 427/96 |
| 4,808,434 | 2/1989 | Bennett et al. | 427/96 |
| 4,833,621 | 5/1989 | Umatate | 437/8 |
| 4,881,029 | 11/1989 | Kawamura | 437/8 |
| 4,912,052 | 3/1990 | Miyoshi et al. | 437/8 |

FOREIGN PATENT DOCUMENTS 61-22691 of 0000 Japan .

Primary Examiner—Brian E. Hearn
Assistant Examiner—Kevin M. Picardat
Attorney, Agent, or Firm—Fay, Sharpe, Beall, Fagan, Minnich & McKee

[57] ABSTRACT

A thick and thin film hybrid multilayer wiring substrate includes an adjustment layer provided between a thick film circuit and a thin film circuit in order to adjust positions of the thick film circuit and the thin film circuit with high integration and large area of the thick and thin film hybrid substrate. The adjustment layer is formed using a direct printing process in accordance with dispersion of the shape of the thick film circuit substrate to absorb the dispersion of the substrate. Further, in order to absorb dispersion of contraction of the thick film substrate due to sintering, a position of a mark provided on the substrate is detected by an electron beam and thereafter a connection pattern is formed to be connected to a regular pattern.

37 Claims, 25 Drawing Sheets

F I G. 20A
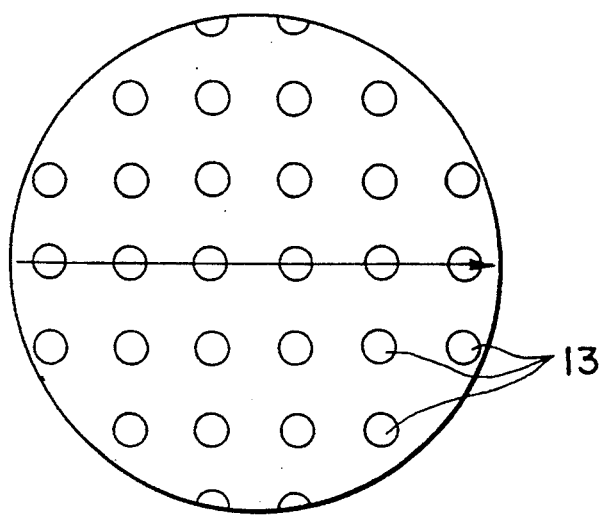
F I G. 20B
F I G. 20C
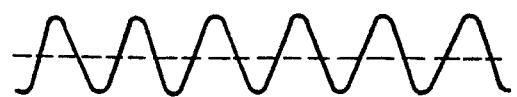
F I G. 20D

F I G. 35
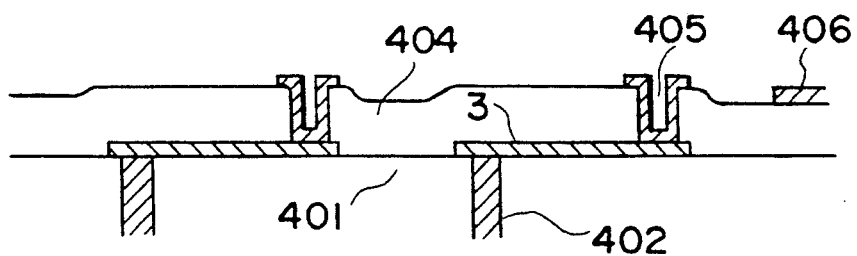
F I G. 36
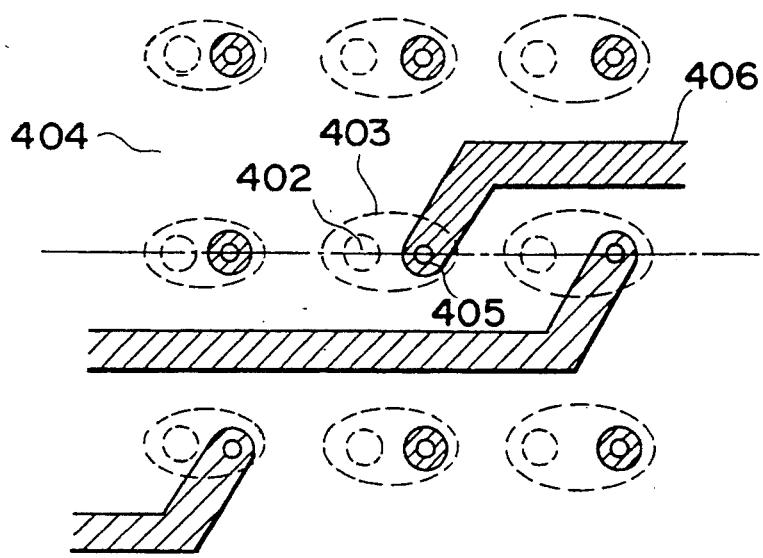
F I G. 37
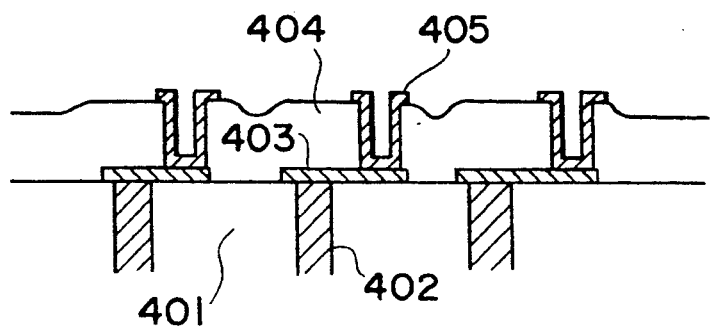

even though positional deviation occurs between the standard pattern of the thin film circuit and the shrunken or contracted pattern of the thick film wiring circuit.

METHOD AND APPARATUS OF FABRICATING ELECTRIC CIRCUIT PATTERN ON THICK AND THIN FILM HYBRID MULTILAYER WIRING SUBSTRATE

BACKGROUND OF THE INVENTION

The present invention relates to a wiring substrate using multilayer wiring and a module including an LSI mounted on the wiring substrate, and more particularly, to a method and apparatus of fabricating electric circuit pattern on a multilayer wiring substrate in the thick and thin hybrid process in which the pattern is fabricated with high density and the fabrication is made with high reliability and high yield.

The technique of mounting LSI chips on one ceramic wiring substrate is growing to be a mainstream mounting technique in a high-speed large-scale digital system such as a large-scale computer or the like. Further, the technical progress of the multilayer wiring substrate used in this technique is remarkable.

A thick film wiring substrate is now fabricated using ceramics or glass ceramics as insulation layers and tungsten or molybdenum as wiring conductors by the green sheet process, for example, and a thin film wiring portion is then formed on an upper surface of the thick film wiring substrate using a mask. Thus, the wiring pattern is fixed as a standard pattern. Such a thick and thin film hybrid multilayer substrate is studied enthusiastically. One problem in the thick and thin film hybrid multilayer substrate resides in that the shrinkage by sintering in the fabrication process of the thick film wiring substrate is largely dispersed. Consequently, there occurs a positional deviation between a position on the thick film wiring substrate varied by the shrinkage and a standard pattern position in the thin film wiring portion and a bad connection is formed.

Incidentally, in the present state, the minimum dimensional tolerance from the center of the thick film wiring substrate to the periphery thereof which can be suppressed is about ±0.5%. Accordingly, when a distance from the center of the thick film wiring substrate to the periphery thereof is 50 mm, the maximum positional deviation is ±250 μm.

One prior art technique (Japanese Patent Application JP-A-58-73193) for solving the bad connection due to the dispersion of the shrinkage of the thick film wiring substrate is described with reference to FIG. 2, in which a multilayer substrate (thick film wiring substrate) 1 of alumina includes ground and power layers 2 made of tungsten sinter and via portions (thick film wiring terminals) 3. The via portion 3 is formed by embedding a tungsten paste into a via-hole formed in an alumina insulation layer 4 and the diameter of the via portion 3 is set to a large diameter in consideration of the dispersion of the shrinkage of the thick film wiring substrate 1 in advance. For example, when the dimension of the substrate is 50 mm, it is 250 μm or more. Further, reference numeral 5 denotes an insulation layer made of polyimide resin. For the purpose thereof, coated prepolymer solution is heat-cured to form polyimide perfectly. Then, the via-hole is formed by means of a photolithographic process using a resist. Further, a wiring 6 is formed on the via-hole and the insulation layer 5. The insulation layers 5 and the wirings 6 are formed alternately so that a thin film wiring portion 7 is formed. In this thick and thin film hybrid wiring substrate, the positional deviation due to the dispersion of the shrinkage of the thick film wiring substrate 1 can be absorbed by setting the diameter of the via portion 3 to a large diameter (about 500 μm), and the bad connection can be prevented.

Further, Japanese Patent Application JP-A-61-22691 discloses a circular metal pad 8 of palladium or the like having a diameter of about 1 mm and a thickness of about 3 μm which is formed on the surface of an upper end portion of the via portion 3 while maintaining the diameter of the via portion 3 to 150 to 200 μm. In this case, as shown in FIG. 3, the circular metal pad 8 is formed so that the positional deviation due to the dispersion of the shrinkage of the thick film wiring substrate 1 can be absorbed and the bad connection can be prevented.

Recently, LSI's progress rapidly with high function and high density, and a pitch between terminals and a diameter of the terminal of the LSI in the present state are in the order of about 450 μm and 200 μm, respectively. In order to achieve such a high density, it is necessary to fabricate not only the upper thin film circuit but also the thick film circuit with high density. However, the conventional substrate has drawbacks as described below. That is, since the diameter of the via portion 2 is enlarged to about 0.5 mm in the example shown in FIG. 2 and the diameter of the circular metal pad on the thick film substrate is further enlarged to 1 mm as compared with the diameter of the via portion, it is difficult to fabricate the multilayer substrate with high density and high yield. It is not allowable to enlarge the diameter of the via portion to about 0.5 mm or enlarge the diameter of the circular conductor on the thick film substrate to 1 mm in the fabrication of the thick film circuit with higher density. It is impossible to fabricate the substrate with high density if the dimension of the diameters is not maintained to the present state or is reduced further. However, if the diameter of the via portion or the circular metal pad is reduced, it is obvious to increase the bad connections.

SUMMARY OF THE INVENTION

It is a first object of the present invention to provide a thick and thin film hybrid multilayer wiring substrate with high density which prevents bad connection due to dispersion of shrinkage of a ceramic or glass ceramic wiring substrate, that is, a thick film wiring substrate.

It is a second object of the present invention to provide a method of fabricating a pattern of a junction layer for junctioning between a thin film wiring substrate and a thick film wiring substrate.

Further, it is a third object of the present invention to provide a method of fabricating a junction layer formed on a thick film wiring substrate.

In order to achieve the first object, the thick and thin film hybrid multilayer wiring substrate composed of the thick film wiring substrate and the thin film wiring substrate formed on the thick film wiring substrate comprises an adjustment layer in which a positional deviation is detected by a position aligning mark to absorb the positional deviation between circuits in an interface between the thick film wiring circuit and the thin film wiring circuit so that terminals are electrically connected to each other. Further, in order to achieve the second object, a positional deviation between a standard pattern of the thin film circuit and a shrunken or contracted pattern of the thick film wiring circuit is obtained to form a pattern of connecting conductor pads in accordance with the deviation. In order to achieve the third object, the connecting conductor pad pattern is formed by a charged particle beam such as an electron beam or an ion beam or by an optical beam.

Actually, FIG. 4 is a sectional view showing a connecting conductor pad pattern formed by a conventional method.

In a conventional drawing method using an electron beam, the position of one or plural position aligning marks 15 is detected as shown in Japanese Patent Application JP-A-63-190 and a position of a pad pattern to be next drawn is obtained from coordinates of the position aligning mark by the interpolation so that a connecting conductor pad pattern is formed symmetrically (concentrically) to a via portion 13. Such a conventional fabrication of the connecting conductor pad pattern has a problem that remarkable positional error occurs in a conductor 22 of an upper thin film circuit 20 due to shrinkage or contraction of the ceramic thick film wiring substrate 10 upon sintering as the conductor exist in the periphery of the substrate and the connection of the conductor is halfway as shown in the left end of FIG. 4. In view of this problem, in the present invention, the pattern of the junction layer is formed in consideration of the conductor pattern 22 of the upper thin film circuit 20 so that a length of the pattern of connecting conductor pads 16 on the surface of the ceramic thick film wiring substrate 10 is different as shown in FIG. 1.

More particularly, in the thick and thin film hybrid multilayer wiring substrate composed of the thick film wiring substrate and the thin film wiring substrate formed on the thick film wiring substrate, there is provided the adjustment layer which detects positional deviation by the position aligning mark to absorb the positional deviation between circuits in an interface between the thick film wiring circuit and the thin film wiring circuit so that terminals are electrically connected to each other. Part of the conductor pad formed in the adjustment layer is elliptical or band-shaped. Further, the part of the conductor pad is directly connected to at least two via portions, of a via portion on the surface of the thick film substrate, a via portion on the bottom of the thin film circuit and a via portion formed in the adjustment layer, using a mask in the vicinity of the terminals but not necessarily in the center of the conductor pad.

In addition, the connecting conductor pads corresponding to the separate substrates and terminals are formed by the electronic line drawing method or the dot printer.

As in the prior art, when the connecting conductor pad is formed so that the center of the via portion in the thick film wiring substrate is aligned with the center of the circular pad, the positional deviation which can be absorbed in the adjustment layer is about ½ of a pitch of the via portions.

On the contrary, according to the present invention, the connecting conductor pads formed in the adjustment layer are elliptical or band-shaped and are directly connected to a plurality of via portion in the vicinity of the terminals but not in the center of the conductor pads, so that the positional deviation which can be absorbed in the adjustment layer can absorb is enlarged to about a pitch of the via portions. Further, the adjustment layer is not limited to a single layer and when a plurality of adjustment layers is formed, the positional deviation equal to or larger than a pitch of the via portion can be also absorbed. Consequently, high densification of the substrate and the module can be achieved by high densification of via holes and wiring and high reliability of the substrate and the module can be further achieved by prevention of bad connection in the thick film circuit and the thin film circuit. The diameter of the via hole formed in the thick film substrate is determined by a capacity of a current flowing therethrough. Although the diameter of the via hole may be small in a signal wiring having a small current capacity, it has been found from an experiment that breaking or disconnection of the conductor can be reduced when the diameter is 150 $\mu$m or less. More specifically, when conductive paste is embedded into the via hole by the printing method, air tends to be involved into the paste filled in the via hole when the diameter of the via hole exceeds 150 $\mu$m. Consequently, the center of an upper surface of the via hole is depressed after the paste has been dried and disconnection tends to occur, while the depression can be improved to a certain extent by twice printing.

The shape of the connecting conductor pad formed to be connected to the (thick) wiring terminals exposed on the surface of the thick film substrate and thin film terminals of the thin film circuit formed thereon is mainly determined by the shape of the via hole. The reason why the pad is formed to be slightly wide in the form of ellipsoid, band or plain dumbbell with a maximum width of 500 $\mu$m or is formed with the middle portion thereof being further wider is to prevent breaking or disconnection effectively when the pad is directly formed on the thick film substrate made of ceramics or the like having large unevenness of the surface.

The position aligning mark on the surface of the thick film wiring substrate is different from a position aligning mark of an ordinary mask or screen and has the following three functions: ① a positioning indication of the thin film circuit pattern disposed on the thick film wiring substrate, ② a fixed quantity of the shrinkage distribution of the thick film substrate, and ③ detection and estimation of the position of the thick film conductor terminal based on the above item ②. In order to achieve these functions, at least five position aligning marks in total, that is, one position aligning mark placed on the center of the substrate and four position aligning marks placed on the periphery are required. However, in principle, only three position aligning marks may be provided. When the distribution of temperature upon sintering is not uniform, more position aligning marks are required since the substrate is contracted complicatedly. If circumstances require, it is necessary that the terminals of the thick film conductors are used as the position aligning marks and the positions thereof are detected. It is necessary that one end of the connecting conductor pad is connected to the terminal for the thick film wiring of the thick film substrate and the other end thereof is connected to the terminal for the thin film wiring thereon. When this connection is achieved, the positional relation of the thin film wiring terminal is known from the prepared thin film pattern and the position of the thick film wiring terminal of the thick film substrate can be detected by the position detection method based on the position aligning mark. Thus, the connecting conductor pad is formed as follows.

① The positional deviation of the thick film wiring terminal is classified into several kinds of patterns and masks corresponding to each of the patterns are prepared and used to form the connecting conductor pads.

② The connecting conductor pads corresponding to each of the individual substrates and terminals are formed by the electronic line drawing method on the basis of the positions of the thick film wiring terminals and the positions of the thin film wirings.

③ The connecting conductor pads corresponding to each of the individual substances and terminals are formed by the dot printer on the basis of the positions of the thick film wiring terminals and the positions of the thin film wirings.

The connecting conductor pads made of at least one kind of metal selected from the group consisting of silver/palladium, platinum, copper, aluminum, gold, nickel, chromium, tungsten and molybdenum are compatible with silver/palladium, platinum, copper, tungsten, molybdenum and gold used as conductor material of the thick film substrate and copper, gold and aluminum used as conductor material of the thin film wiring circuit so that the thick and thin film hybrid multilayer wiring substrate capable of ensuring long life can be achieved.

The foregoing can be applied to electrical connection between layers in the thin film layer. Particularly, when the shrinkage of the thick film substrate varies largely and the variation can not be absorbed by only one layer completely, the variation can be absorbed by several layers.

BRIEF DESCRIPTION OF THE DRAWINGS

FIGS. 19, 20A, 20B, 20C, 20D, 21, 22A and 22B are diagrams explaining methods of measuring pattern position coordinates used in the present invention, respectively;

FIG. 35 is a sectional view of via portions and wiring of the thin film circuit in the embodiment 1;

FIG. 36 is a plan view of via portions and wiring of the thin film circuit in an embodiment 3;

FIG. 37 is a sectional view of via portions and wiring of the thin film circuit in the embodiment 3;

DESCRIPTION OF THE PREFERRED EMBODIMENTS

Embodiment 1

Figure 1:
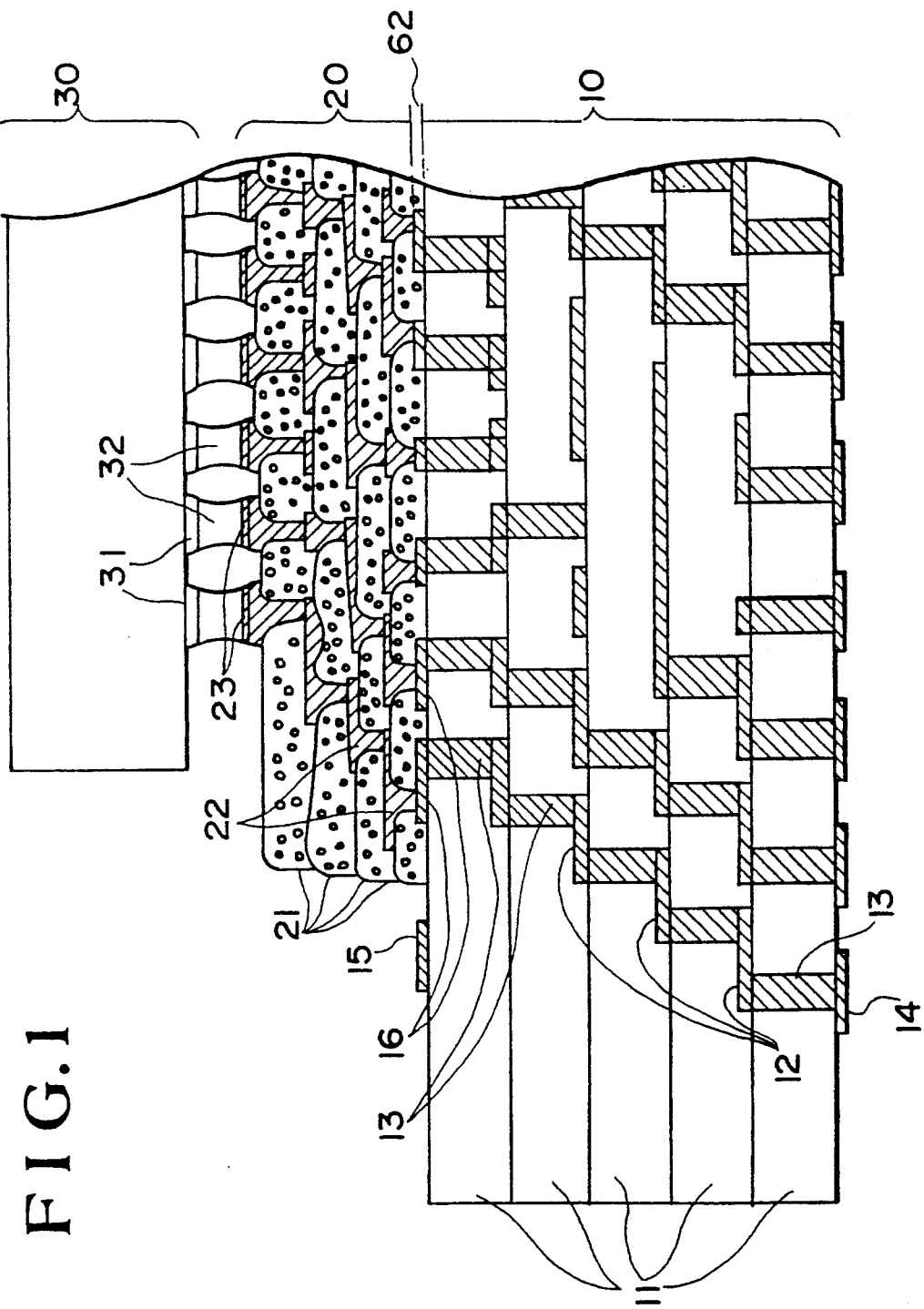
FIG. 1 is a sectional view explaining a fabricating method of a thick and thin film hybrid multilayer wiring substrate according to an embodiment of the present invention.
Figure 2:
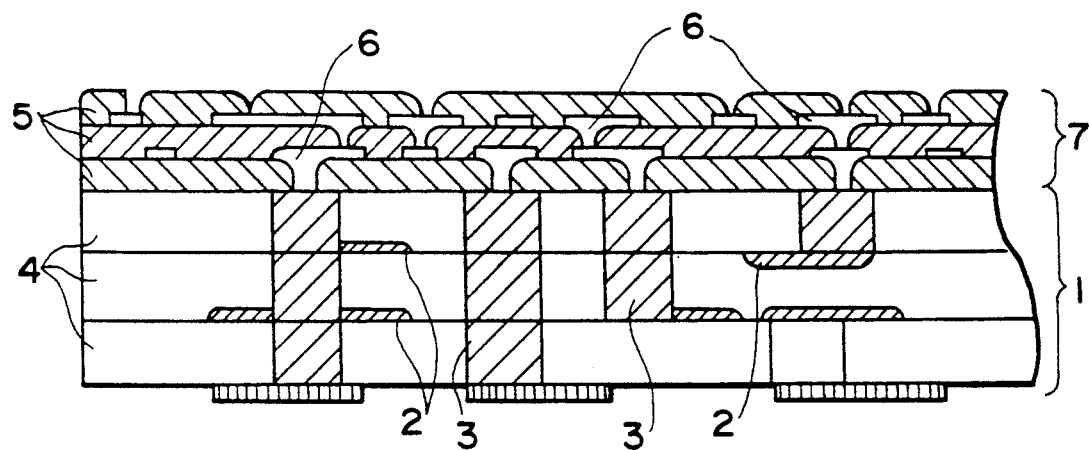
FIGS. 2, 3 and 4 are sectional views explaining prior arts, respectively.
Figure 3:
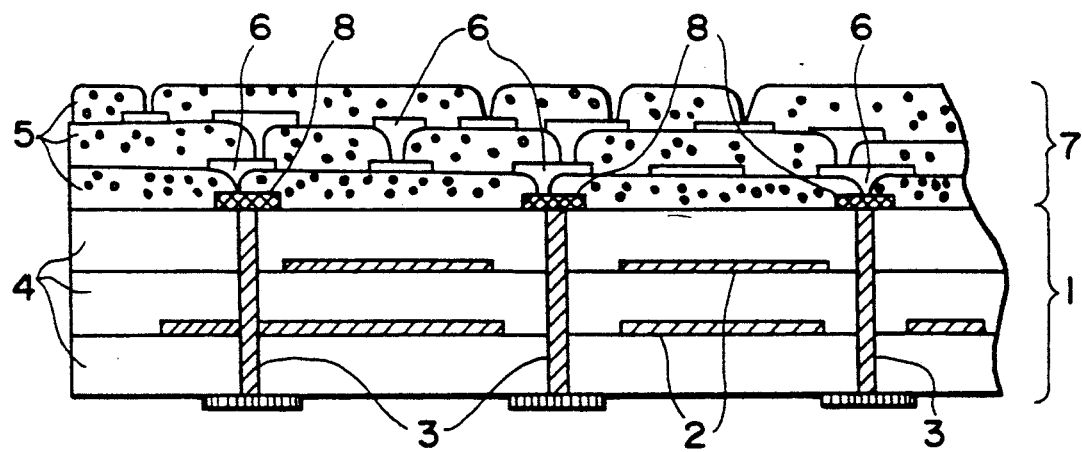
Figure 4:
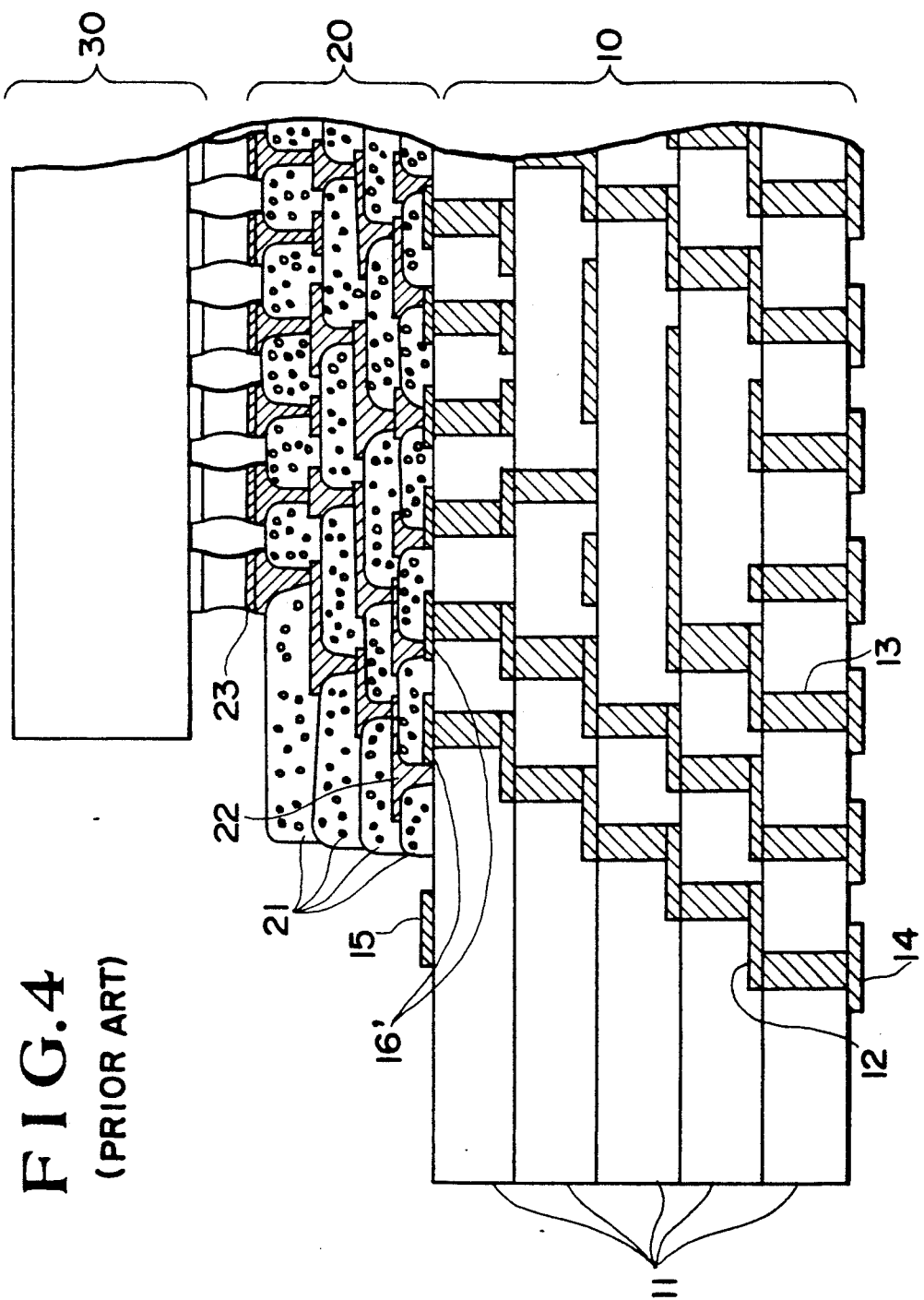

The present invention is now described in detail with reference to an embodiment shown in FIG. 1, which shows a thick and thin film hybrid multilayer wiring substrate to explain a fabricating method thereof.

A ceramic thick film wiring substrate 10 includes five alumina substrates 11. Inner layer conductors 12 made of paste such as tungsten or molybdenum are printed on each of the alumina substrates 11 and a position aligning mark 15 made of the paste is printed on the surface of the alumina substrate 11. The individual alumina substrates 11 are stacked with one another and are then sintered so that the substrate 11 is fabricated. Via portions (ceramic wiring terminals) are formed in the ceramic thick film wiring substrate 10. The via portion 13 is formed by embedding tungsten or molybdenum paste into a via hole formed to penetrate the alumina substrates 11 and sintering them. Lands 14 are formed on the rear surface (bottom) of the substrate 10 to cover the via portions 13 exposed thereon.

Further, connecting conductor pads 16 are formed on the surface (upper surface) of the ceramic thick film wiring substrate 10 to be electrically connected to the via portions 13 exposed from the surface of the substrate 10. The connecting conductor pads 16 are formed into an eliptical shape or into a band with both ends being semicircular, and the maximum width is 50 to 500 μm. The connecting conductor pads 16 constitute an adjustment layer 62 for adjusting the connection between wiring conductors 22 in a thin film wiring substrate 20 formed on the connecting conductor pads 16 and the via portions 13.

In this connection, when the substrate 10 is of 100 mm square, the diameter of the via portion 13 is about 50 to 150 μm.

A fabricating method of the connecting conductor pad 16 for adjustment is as follows:

(1) A positional relation between the via portions 13 and the position aligning mark 15 on the surface of the ceramic wiring substrate in a standard sintering and shrinkage is defined in advance on the basis of sintering and shrinkage data of a substrate fabricated on trial. A thin film circuit having via portions corresponding to the positions of the via portions of the ceramic wiring substrate by the standard sintering and shrinkage is designed and a mask thereof for the photolithography is prepared.

(2) The ceramic multilayer wiring substrate 10 is prepared using the conventional thick film multilayer wiring and stacking technique.

Figure 23:
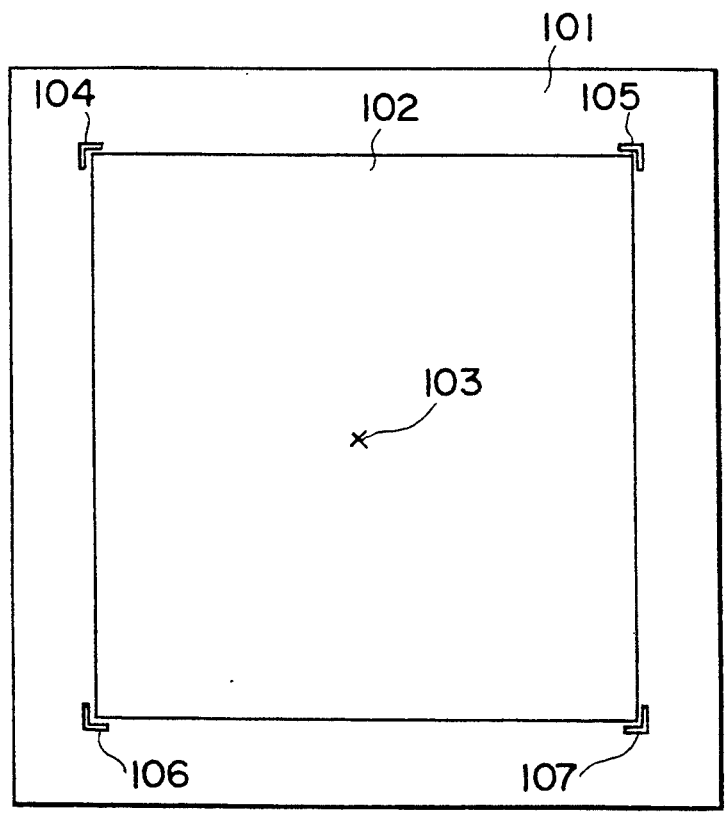
FIG. 23 is a diagram showing a position aligning mark on a fabricated thick film wiring substrate.
Figure 24:
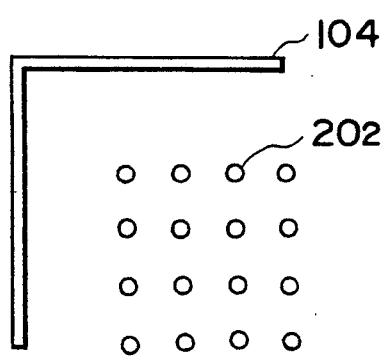
FIG. 24 is an enlarged view of the position aligning mark in upper left corner of FIG. 23.
Figure 25:
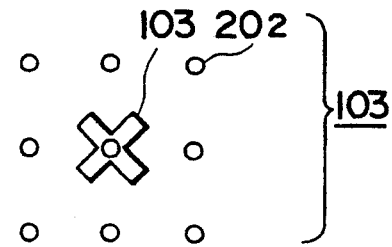
FIG. 25 is an enlarged view of the position aligning mark placed in the middle of FIG. 23.

(3) Five position aligning marks 15 (in principle, three position aligning marks may be provided) placed in the center and the periphery on the surface of the ceramic multilayer wiring substrate 10 are detected by utilizing the pattern recognition technique of a secondary electronic image of the electron beam. Shapes of the position aligning mark are shown in FIGS. 23 to 25. FIG. 23 shows a position aligning mark 103 placed in the center and position aligning marks 104 to 107 placed in four corners of the circuit wiring portion of an alumina multilayer substrate 102. FIG. 24 shows in detail the position aligning mark 104 and via portions 202 placed in upper left portion of the substrate as a representative of the four corners of the circuit wiring portion. FIG. 25 shows in detail the position aligning mark 103 placed in the center of the circuit wiring portion. In FIGS. 24 and 25, circles represent the via portions 202 on the surface of the thick film substrate.

(4) The positions of the via portions on the surface of the ceramic wiring substrate are estimated in accordance with deviation between the position of the position aligning mark 15 on the ceramic wiring substrate affected by the sintering and shrinkage performed in the above process (1) and the detected position in the above process (3) by the linear approximation method using a computer.

Figure 32:
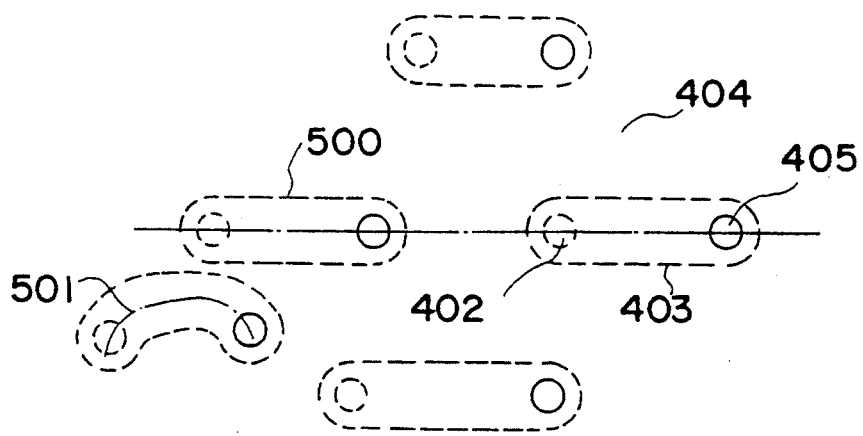
FIG. 32 is a plan view showing through holes formed in an insulation layer of the thin film circuit in the embodiment 1.

(5) A plane positional relation between the estimated positions of the via portions on the surface of the ceramic wiring substrate and via portions of the thin film circuit connected electrically to the via portions on the surface of the ceramic wiring substrate is computed. A virtual straight line connecting the center of the via portions of the ceramic substrate with the center of the via portions of the thin film circuit corresponding thereto is drawn. Thus, a virtual curve 500 shown in FIG. 32 is drawn apart from the virtual straight line by 150 μm.

(6) A metal film constituting a connecting conductor pad having an external shape formed by the virtual curve 500 is formed.

In the above method, the virtual straight line connecting the center of the via portions of the thin film circuit with the center of the via portions of the ceramic substrate is used, while there is no problem if a virtual curve 501 connecting the respective centers is used.

In this case, the metal film is formed widely in consideration of dispersion of the shrinkage of the ceramic substrate. The whole area in the vicinity of the via portion is covered by a metal film if necessary. There are two kinds of film forming methods. That is, ① in the case where film is formed by printing: at least one kind of metal selected from a group consisting of gold, silver/palladium, platinum and copper is used to form the film by the printing method and the film is then sintered. ② in the case where film is formed by the thin film technique such as vapor-deposition and sputtering: at least one kind of metal selected from a group consisting to aluminum, gold, copper, nickel and chromium is used to form the film by the vapor-deposition and sputtering. A negative type resist resin having characteristics sensitive to an electron beam, vulcanizable in response to irradiation of the electron beam and insoluble by the development performed thereafter is applied on the metal film constituting the connecting conductor pad 16.

(7) Positional deviation of the position aligning mark obtained in (3) or a main via portion, if necessary, from a predetermined position is obtained and a patternized electron beam is irradiated on the negative type resist resin on the pattern of the connecting conductor pad to form the connecting conductor pad which electrically connects the via portion with the thin film circuit formed thereon.

(8) The negative type resist resin is developed using a developer to remove the resin not irradiated by the electron beam.

(9) An etching solution suitable for etching of nitric acid which is applicable in metal-film etching process is used to remove portions of metal film having the surface uncovered by resin.

(10) The left metal film is subjected to heat treatment to form the connecting conductor pad 16 joined to the ceramic substrate exactly and strongly.

In the thin film circuit 20 formed thereon, insulation layers 21 made of polyimide resin or silicon oxide which is cured at a low temperature and accordingly is not almost contracted and conductors 22 made of aluminum, gold, copper or the like are formed by the conventional thin film technique. Further, pads 23 formed on the uppermost portion of the thin film circuit are connected to connecting terminals 31 of an LSI 30 through solder 32 to thereby complete the module.

Here, the method of determining the position of the connecting conductor pad pattern according to the present invention is described which is quite different conceptually from the conventional position determination method of the electron beam drawing apparatus.

FIG. 1 shows the structure of the thin film wiring portion on the ceramic wiring substrate in the case where the pad pattern is formed by the pattern position determination method of the present invention as described above.

More particularly, in the method of the present invention, the position aligning mark is detected to obtain the position of the via portions 13 and the pad pattern 16 is drawn so that the via portions 13 are connected to the conductors 22 having the positions determined by the positions of the terminals of the upper LSI 30 to thereby complete conduction or connection can be achieved without halfway connection. With the pads 16 thus fabricated, the connection pattern without bad connection can be formed as shown in FIG. 1.

Figure 5:
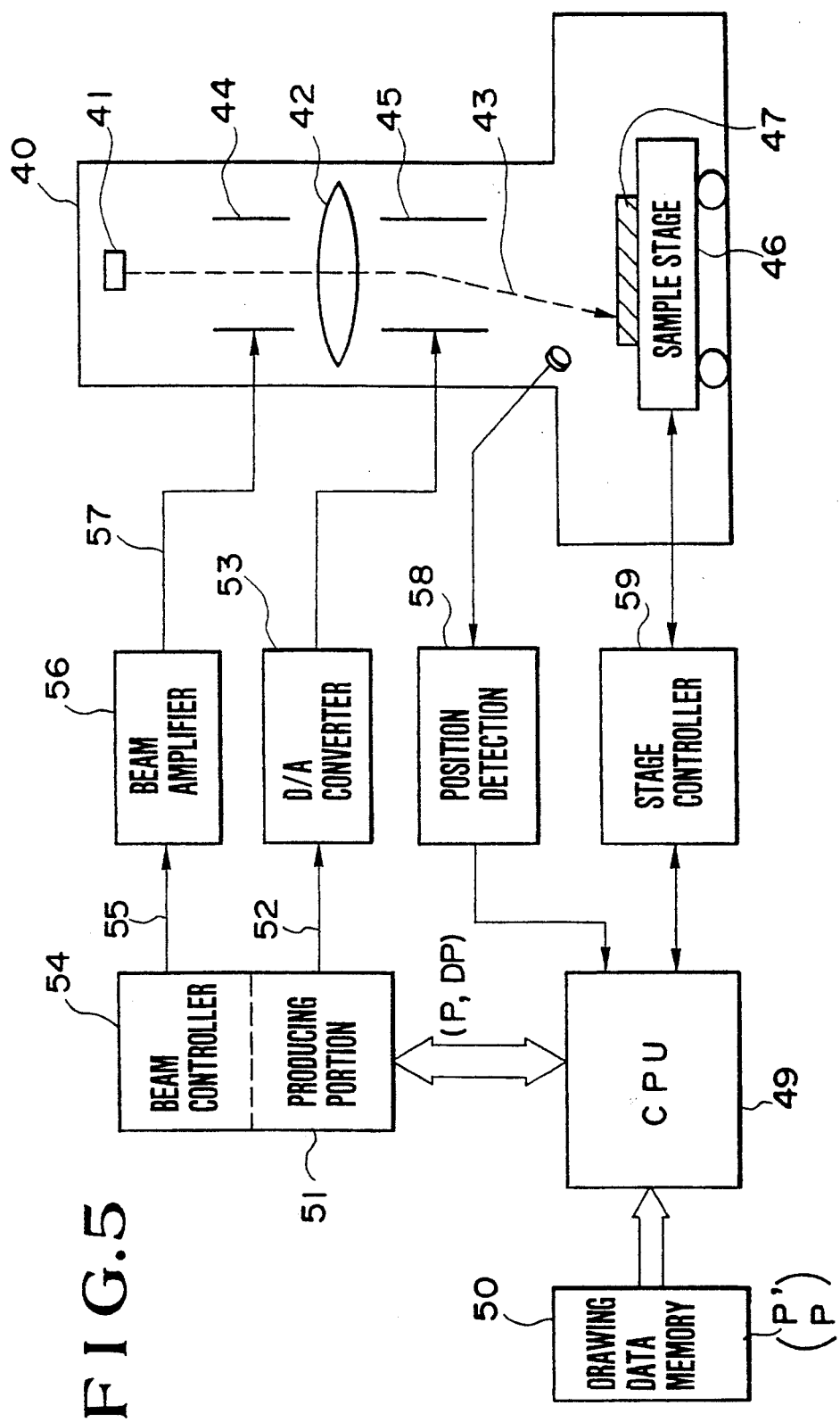
FIG. 5 is a block diagram showing an example of a configuration of a pattern drawing apparatus using an electron beam used in the embodiment of the present invention.

FIG. 5 is a block diagram showing a configuration of a drawing apparatus of the connecting conductor pad pattern using an electron beam. A mirror body 40 is evacuated to a vacuum so that an electron beam can be moved. An electron beam 43 emitted from an electron gun 41 is made small by an electron lens 42 and strikes on a thick film wiring substrate (sample) 47 placed on a sample stage 46 through a beam blanker 44 and a deflector 45. The sample is $100 \times 100$ mm$^2$ in size and is controlled by a stage controller 59. The electron beam can be deflected over a range of $100 \times 100$ mm$^2$ in response to a command from a computer 49 to thereby draw a pattern of the connecting conductor pad 16 on the thick film wiring substrate 47.

Figure 6:
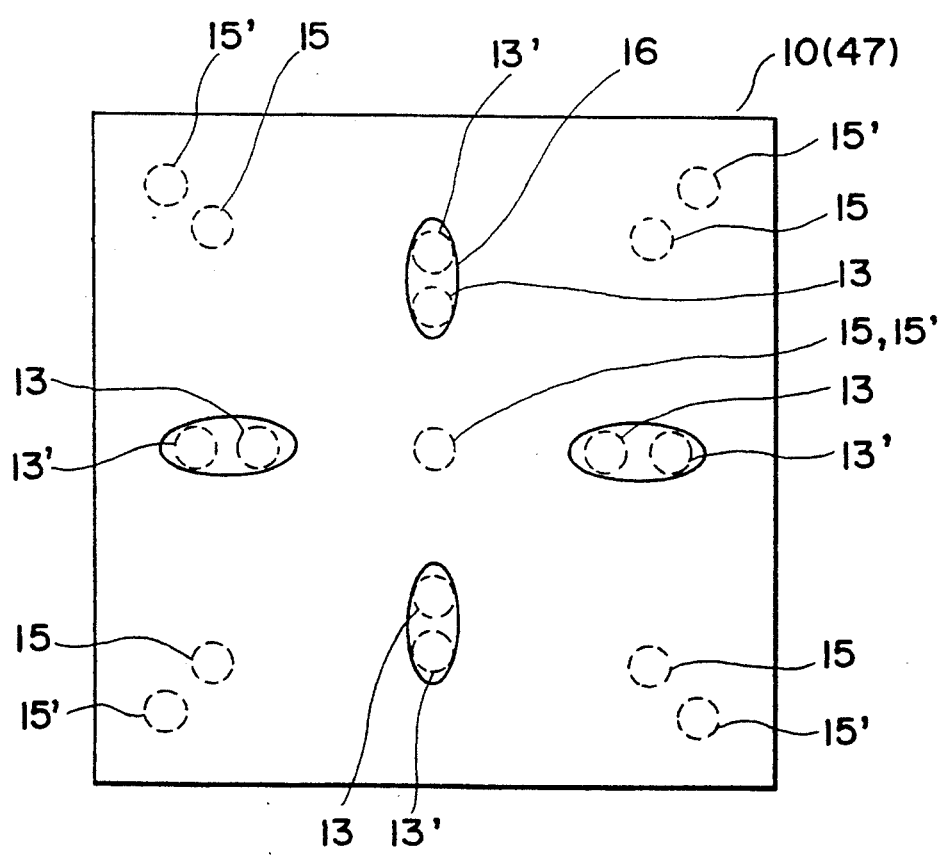
FIG. 6 is a diagram explaining an example of a pattern adjusting method used in a pattern fabricating method of the present invention.

As described above, the thick film wiring substrate 47 contracts or shrinks by sintering. The shrinkage is different for each substrate and is also dispersed even in a plane of the same substrate. Accordingly, it is necessary that the position where the pad pattern 16 is drawn is determined in advance of the drawing in detail. In the embodiment, when the via portion 13 shown in FIG. 1 is formed, the position aligning mark 15 having a known relative position to the via portion 13 is formed. FIG. 6 shows an example in which five position aligning marks are provided. These marks are scanned by an electron beam and a reflected electron is detected as a digital signal after amplification of a signal from a detector 48 shown in FIG. 5 by a position detection circuit 58 so that the contraction state of the substrate is obtained in advance of the drawing. FIG. 7 shows an example of a method of estimating the position of the via portion 13 on the basis of a reflection electron detection signal Se.

Figure 7A:
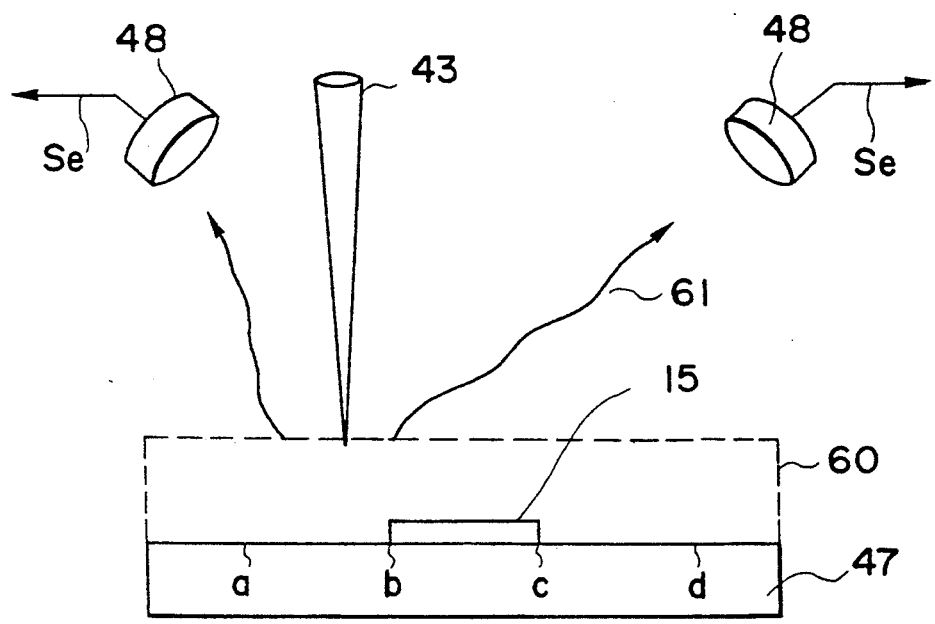
FIG. 7A and FIG. 7B are diagrams explaining a pattern position detection method using an electron beam used in the present invention.
Figure 7B:
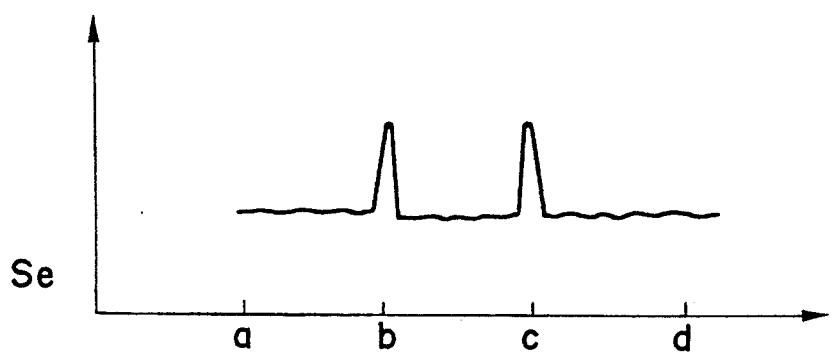

As shown in FIG. 7A, when a position aligning mark 15 on a substrate 47 is scanned by an electron beam 43, strong reflected electron signals 61 are produced from an edge portions b and c of the mark 15. The output signal Se of the detector 48 is shown in FIG. 7B. Central coordinates of the mark can be calculated on the basis of two peak positions b and c of the detection signal.

In FIG. 7A, reference numeral 60 denotes a resist layer for forming a pattern of the connecting conductor pad 16. When the energy of the electron beam 43 is sufficiently high and the beam reaches the mark 15 at the bottom of the resist, the resist 60 may be not changed as it is. However, when the energy of the beam is low and the two- or three-layer resist process is used, an incident electron does not reach the mark. In such a case, the resist in the periphery of the mark is made thin in advance by using an ion beam or the like, or the resist is removed completely to expose the mark. Thus, five coordinates of actual position aligning marks 15 and 13 shown in FIG. 6 are obtained. When original positions of the marks are represented by 15' and 13' and the coordinates of the mark positioned at the center are positioned to coincide with those of the original position thereof, it will be understood that the marks in the periphery exist in positions 15 shifted inside of the original positions 15' thereof, for example, as shown in FIG. 6. Thus, the shrinkage of the substrate can be estimated in X and Y directions. That is, the via portions 13 are shifted to the positions 13 from the original positions 13' in the contracted substrate. In FIG. 1, the original positions P' correspond to known positions (standard pattern position) determined in accordance with a design of the thin film wiring substrate 20 on the basis of positions of the terminals 23 connected to the LSI 30. On the contrary, the positions P of the via portions provided already in the substrate can be calculated from the measured value as described above. The calculation is made in a CPU 49.

A difference DP between the detected and already provided via position P and the via position P' inputted to a drawing data memory 50, that is, DP=P''−P is calculated, and the position P and the difference DP are supplied to a coordinate data producing portion 51.

These data for all of the via portions are stored in the producing portion 51. A pattern of the connecting pad 16 is drawn on the sample substrate 47 by an electron beam on the basis of the data. In the drawing, the coordinate data 52 from the coordinate data producing portion 51 is converted into a deflection voltage to be applied to the deflector 45 through a D/A converter 53, while a beam control signal 55 from a beam controller 54 is converted into a blanking voltage 57 to be applied to the blanker through a beam amplifier 56. The resist used in the drawing may be positive type or negative type.

Further, in the above description, the electron beam can be deflected over the range of 100 mm by 100 mm. In general, however, it is not easy to deflect the beam over such a large area while the beam is made small. In this case, a so-called step and repeat system using the deflection of the beam and the movement of the stage may be used.

Figure 8:
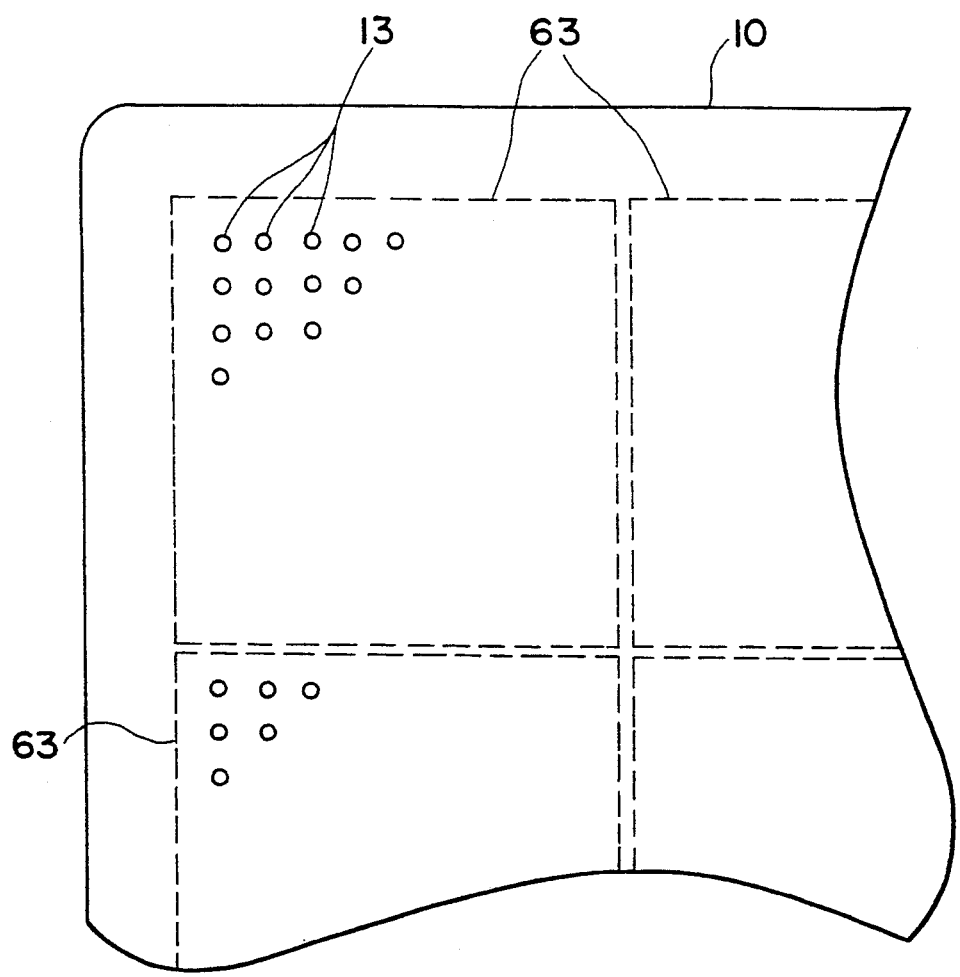
FIGS. 8, 9A, 9B, 10 and 11 are diagrams explaining an embodiment of a pattern fabricating method according to the present invention.

In the embodiment, the five marks are represented over the whole range of $100 \times 100$ mm$^2$, while it is necessary to detect marks in more detail when the contraction is dispersed over the whole area. FIG. 8 is a diagram explaining such a case. The thick and thin film hybrid multilayer wiring substrate 10 is $100 \times 100$ mm$^2$ in size and via portions 13 having a diameter of 50 $\mu$m are formed in the substrate 10 at a design pitch of 150 $\mu$m.

In the embodiment, there is described a case where the via portions themselves are used as the position aligning marks instead of the special position aligning marks. The substrate 10 is divided into a plurality of blocks 63 each having a size of $10 \times 10$ mm$^2$. Positions of the via portions 13 in each of the blocks are measured to calculate deviation thereof from the original positions thereof. Thereafter, the connecting pattern 16 is formed.

With such a method, a memory circuit which stores the positions of the via portions can be made small to 1/100 in the capacity as compared with a method in which the substrate is not divided into blocks. Further, the pattern formation position is calibrated for each blocks so that the connecting conductor pattern 16 can be formed with high accuracy.

Figure 9A:
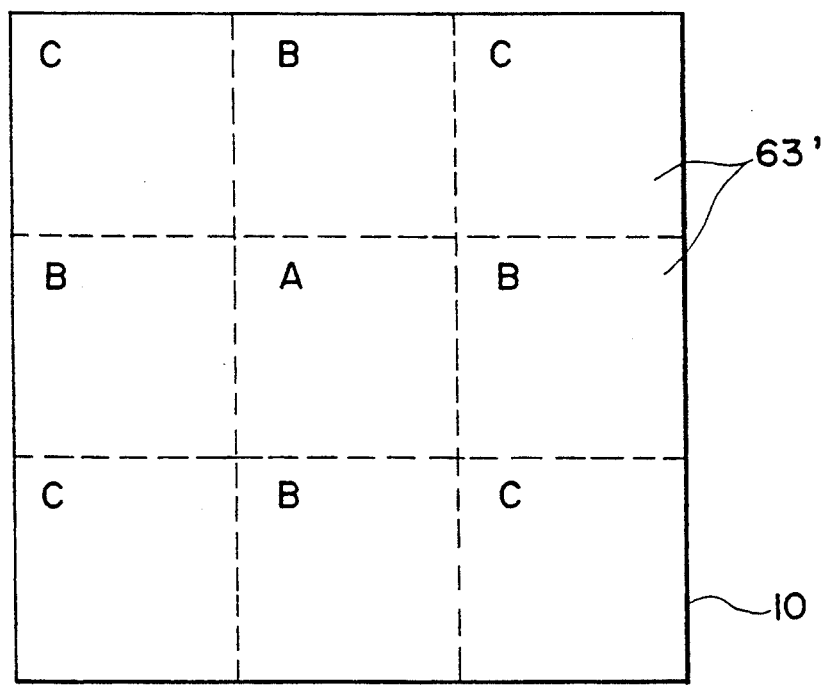
Figure 9B:
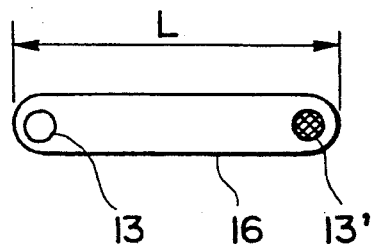

FIGS. 9A and 9B show another embodiment according to the present invention. The thick and thin film hybrid multilayer wiring substrate 10 is $100 \times 100$ mm$^2$ in size and the via portions 13 having the diameter of 50 $\mu$m are formed in the substrate at a pitch of 150 $\mu$m.

In the embodiment, attention is paid to the fact that deviation of the actual via portion 13 formed in the substrate 10 from the standard pattern position 13' is depend on a distance from the center of the substrate and the following method is adopted. More particularly, the substrate 10 is divided into 9 blocks 63' as shown in FIG. 9A so that a length L of the connecting conductor pad pattern 16 from the via portion 13 to its standard position 13' is equal to or less than an integral multiple of a pitch (that is, 150 $\mu$m) of the via portion 13 as shown in FIG. 9B.

Consequently, the deviation of the via portion from the original position is equal to or less than 150 $\mu$m in a block A and accordingly the positional deviation is corrected by a single layer of connecting pattern. In a block B, since the deviation is 150 to 300 $\mu$m, the positional deviation of the via portion 13 is corrected by two layers of connecting pattern. Similarly, in a block C, the deviation of 300 to 450 μm is corrected by three layers.

With the above method, it is not necessary to form a long connecting pattern on the substrate 10 and the connecting pattern can be formed simply with improved yield.

A method of fabricating the via portion is now described.

Figure 26:
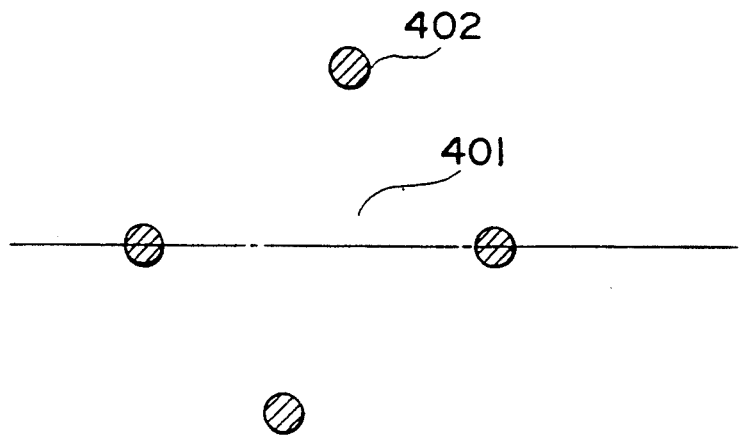
FIG. 26 is a plan view of the surface of a thick film wiring substrate in an embodiment 1.
Figure 27:
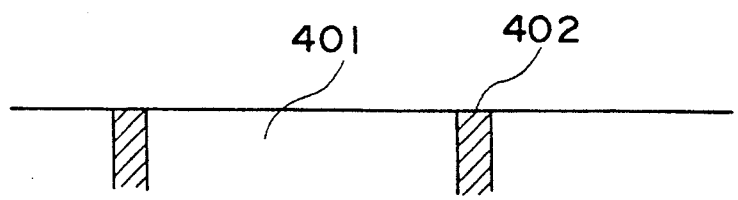
FIG. 27 is a sectional view of the surface of the thick film wiring substrate in the embodiment 1.
Figure 28:
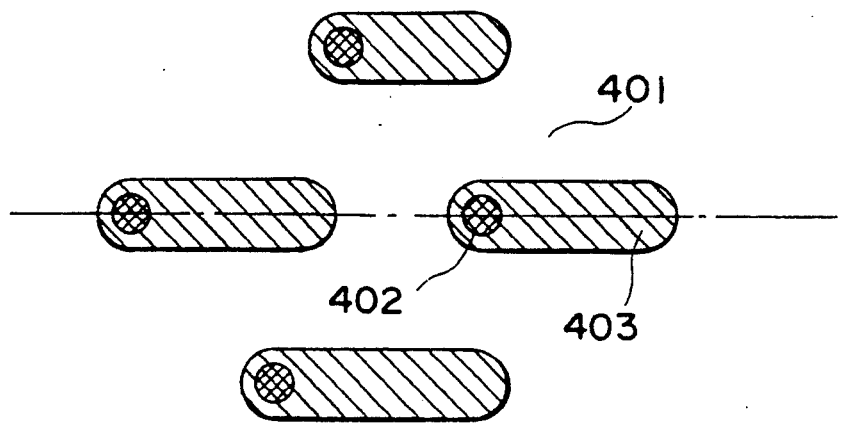
FIG. 28 is a plan view showing an adjustment layer formed in the surface of the thick film wiring substrate in the embodiment 1.
Figure 29:
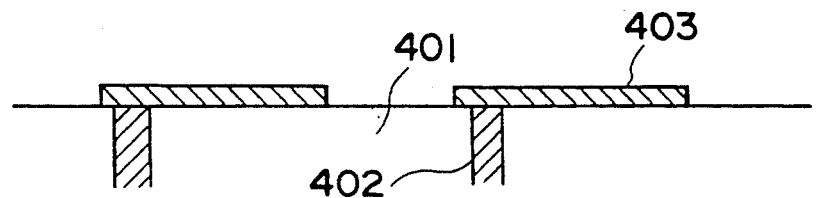
FIG. 29 is a sectional view showing an adjustment layer formed in the surface of the thick film wiring substrate in the embodiment 1.
Figure 30:
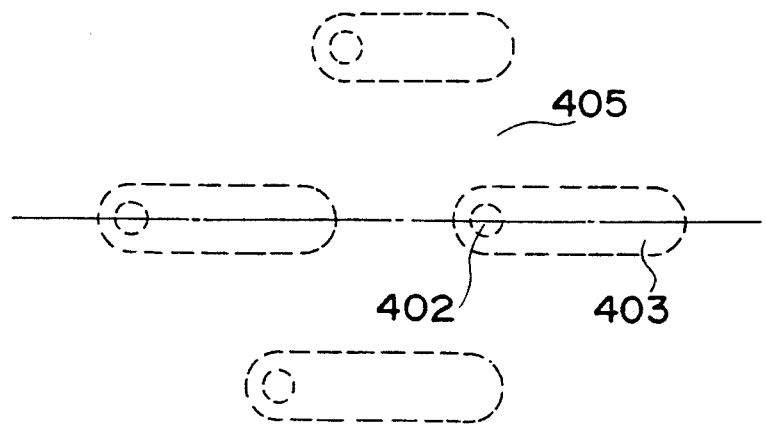
FIG. 30 is a plan view showing an insulation layer and a patterning aluminum film formed in the surface of the adjustment layer in the embodiment 1.
Figure 31:
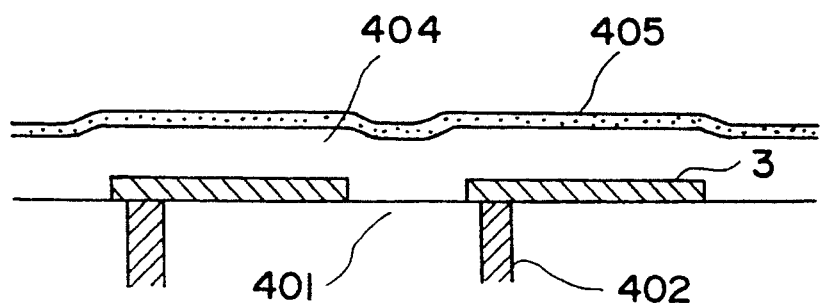
FIG. 31 is a sectional view showing the insulation layer and the patterning aluminum film formed in the surface of the adjustment layer in the embodiment 1.
Figure 33:
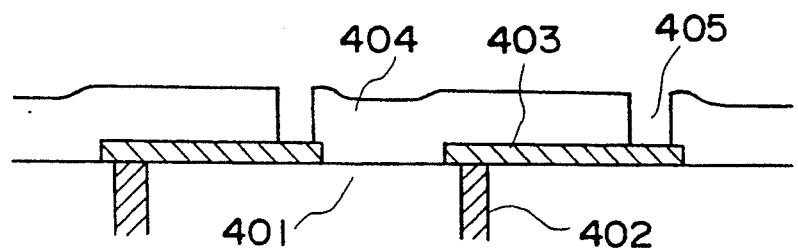
FIG. 33 is a sectional view showing through holes formed in the insulation layer of the thin film circuit in the embodiment 1.
Figure 34:
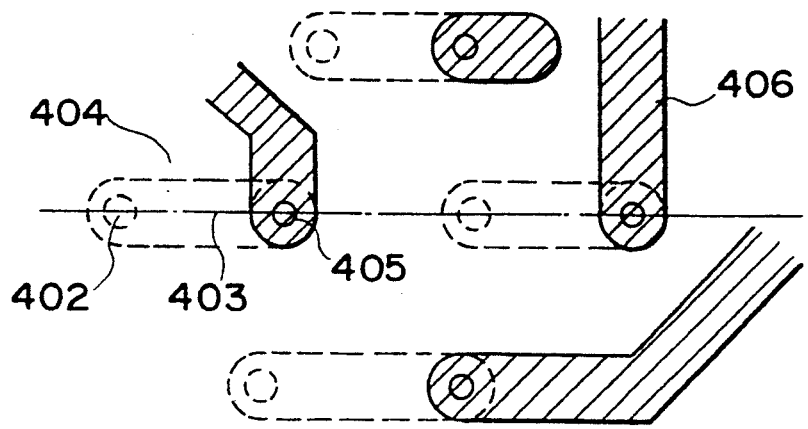
FIG. 34 is a plan view of via portions and wiring of the thin film circuit in the embodiment 1.

FIGS. 26 to 35 schematically illustrate a fabricating process of via portions on the surface of a thick film wiring substrate (alumina multilayer substrate) 401 and a thin film circuit. That is, FIGS. 26 and 27 show via portions 402 on the surface of the thick film wiring substrate and are a plan view and a sectional view of the via portions 402, respectively. FIGS. 28 and 29 show an adjustment layer formed on the thick film substrate and are a plan view and a sectional view, respectively. A band-shaped connecting conductor pads 403 are formed on the via portions 402. FIGS. 30 and 31 show an insulation layer 404 of the thin film circuit and an aluminum layer 405 disposed on the adjustment layer and the aluminum layer 405 is used in patterning of the insulation layer. FIGS. 30 and 31 are a plan view and a sectional view, respectively. FIGS. 32 and 33 show through holes formed by the dry etching in via portions of the insulation layer of the thin film circuit with the upper aluminum film being removed. FIGS. 32 and 33 are a plan view and a sectional view, respectively. FIGS. 34 and 35 show the via portions 402 of the insulation layer 404 and wiring 406 formed in the thin film circuit and are a plan view and a sectional view, respectively.

Further, an LSI 40 is connected to the pad 23 shown in FIG. 1 and formed on the uppermost portion of the thin film circuit of the thick and thin film hybrid multilayer wiring substrate by using solder of tin or lead, so that a module is completed.

Embodiment 2

The green sheet process is used in the same manner as in the embodiment 1 to fabricate a three-layer alumina substrate having a size of 100 mm square. Via portions made of tungsten conductor and having a diameter of 70 μm are formed in the uppermost layer of the substrate at a pitch of about 450 μm.

The fabrication method of the connecting conductor pad is the same as the embodiment 1. However, the conductor pad is in the form of plane dumbbell except a circle in the center and the maximum width of the conductor pad is 150 μm. The thin film circuit is formed of two layers and the whole substrate is substantially the same as that of FIG. 1 except the number of layer.

Embodiment 3

Molybdenum is used as a conductor and the same green sheet process as that of the embodiment 1 is adopted to fabricate a three-layer alumina substrate having a size of 70 mm square. Via portions 402 made of molybdenum conductor and having a diameter of 150 μm are formed in the uppermost layer of the substrate at a pitch of about 450 μm. The position aligning marks on the surface of the substrate are disposed at three locations in total of a center and both ends of the substrate. A shape of the connecting conductor pad is elliptical with a maximum width of 500 μm. The fabricating process is the same as that of the embodiment 1. An adjustment layer is schematically illustrated in FIGS. 36 and 37, which are a plan view and a sectional view, respectively. Reference numeral 401 denotes an alumina multilayer substrate, 402 via portions, 403 connecting conductor pads of the adjustment layer, 404 an insulator layer of the thin film circuit, 405 via portions of the thin film circuit, and 406 wiring portions of the thin film circuit.

Embodiment 4

The green sheet process is used in the same manner as in the embodiment 1 to form a five-layer mullite substrate having a size of 100 mm square. Via portions made of tungsten conductor and having a diameter of 70 μm is formed in the uppermost layer of the substrate at a pitch of about 450 μm.

The fabricating method of the connecting conductor pad is the same as that of the embodiment 1 except that the conductor pad is made of aluminum and the maximum width thereof is 150 μm. Further, the thin film circuit is also of a four-layer and is formed using the same fabrication method as that of the embodiment 1 except that aluminum is used as conductor material.

Embodiment 5

The green sheet process is used in the same manner as in the embodiment 1 to form a five-layer mullite substrate having a size of 150 mm square. A diameter of the via portion constituting a signal wiring of the substrate is 100 μm.

The fabrication method of the connecting conductor pad 16 is made as follows.

(1) A positional relation between the via portions 13 and the position aligning mark 15 on the surface of the ceramic wiring substrate in a standard sintering and shrinkage calculated on the basis of sintering and shrinkage data of a substrate fabricated on trial is defined in advance. Via portions of the thin film circuit being into contact with the adjustment layer are designed in accordance with the positions of the via portions of the ceramic wiring substrate by the standard sintering and shrinkage and a mask thereof for the photolithography is prepared.

(2) The ceramic multilayer wiring substrate 10 is prepared using the conventional thick film multilayer wiring and stacking technique.

(3) Positions of five position aligning marks 15 in total placed in the center and the periphery and all of via portions are detected by utilizing the pattern recognition technique of a secondary electron image of the electron beam before the connecting conductor pads for the adjustment layer are formed.

(4) The detected positions of all of the via portions 402 on the surface of the thick film wiring substrate are generally not aligned with the positions of all of the via portions 408 of the thin film circuit of (1) overlapped thereon on the basis of the position aligning mark. It is assumed that the thin film circuit of (1) is overlapped on the thick film wiring substrate. The X-direction (horizontal direction) and the Y-direction (vertical direction) are set in the substrate. A virtual line passing through the center of the via portion 402 on the surface of the thick film wiring substrate is drawn in the X-direction while a virtual line passing through the center of the via portion on the bottom of the thin film circuit connected to the via portion is drawn in the Y-direction so that the position of the intersection between the virtual lines in the X- and Y-directions is determined for all of the via portions through a computer.

(5) A virtual line in the X-direction connecting the central position of the via portions on the thick film substrate with the intersection of the virtual lines obtained in (4) and corresponding to the central position is set and a square surrounded by first two parallel lines apart from the virtual line in the X-direction by 150 μm and second two parallel lines orthogonal to the first two parallel lines and passing through points extrapolated at both sides of the virtual lines in the X-direction by 150 μm is determined as shown a virtual curve 500 of FIG. 32.

(6) The square obtained by 5) is formed on the thick film wiring substrate using copper material. This is the connecting conductor pad 403. The fabrication method of the conductor pad is the same as in the embodiment 1.

(7) Polyimide resin is applied on the thick film wiring substrate including the connecting conductor pad 403 and is then sintered to form an insulation layer of a thickness of 5 μm.

(8) Aluminum film having a thickness of about 1 μm is formed on the whole surface of the insulation layer of (7) by means of the vapor-deposition method.

(9) A negative type resist resin sensitive to an electron beam is applied on the whole surface of the aluminum film and is cured.

(10) The cured resist resin is selectively irradiated with an electron beam except a circle having a diameter of 100 μm and a center placed in the intersection of the virtual lines in the X- and Y-direction. (11) The resist resin which is not irradiated with the electron beam is removed by the development and rinse operation.

(12) An etching solution made of phosphoric acid, nitric acid or the like is used to remove portions of the aluminum film not covered by the resist.

(13) An exfoliation solution for the resist is used to remove the resist resin covered on the aluminum film.

(14) The polyimide resin film not covered by the aluminum film is removed by the directional dry etching technique using oxygen gas.

(15) The etching solution of (12) is used to remove the aluminum film on the polyimide resin.

(16) Via portions made of copper are formed in holes of the polyimide resin film removed by the dry etching by means of the electroless copper plating.

(17) Copper is formed on the polyimide resin film in which the copper via portions are formed by 2 μm by means of the sputtering technique.

(18) A negative type resist resin sensitive to an electron beam is applied on the whole surface of the copper film and cured.

(19) A virtual line in the Y-direction connecting the central position of the via portions 408 on the bottom of the thin film circuit with the intersection of the virtual lines obtained in (4) and corresponding to the central position is set and a square surrounded by first two parallel lines apart from the virtual line in the Y-direction by 150 μm and second two parallel lines orthogonal to the first two parallel lines and passing through points extrapolated at both sides of the virtual lines in the Y-direction by 150 μm is determined.

(20) The square connecting conductor pad 407 obtained in (19) is formed on the polyimide resin film by means of the selective irradiation of the electron beam, the development and rinse operation, and the etching of copper in the same manner as above.

(21) The thin film circuit substrate of FIG. 1 formed on the connecting conductor pad is formed using polyimide resin as the insulation layer 21 and copper as the conductor 22 by means of the conventional thin film technique. Thus, the thick and thin film hybrid multilayer wiring substrate is formed.

Figure 38:
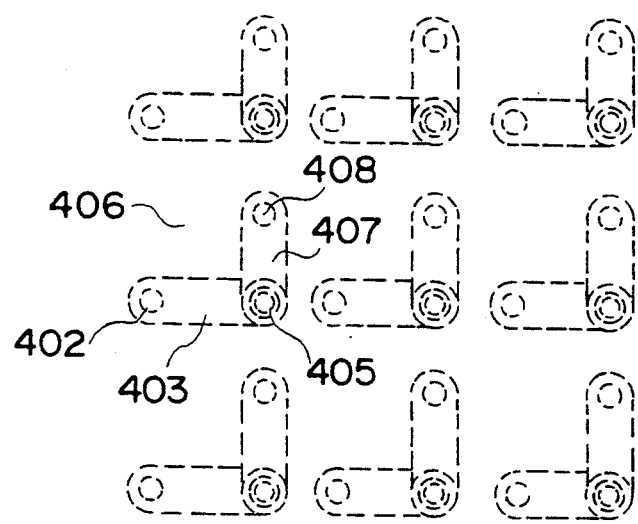
FIG. 38 is a plan view of via portions and wirings of the thin film circuit in an embodiment 5.
Figure 39:
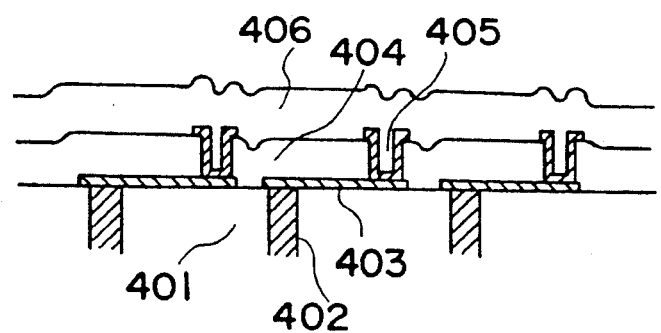
FIG. 39 is a sectional view of via portions and wiring of the thin film circuit in the embodiment 5.

FIGS. 38 and 39 show the vicinity of the adjustment layer in plan and section, respectively.

(22) The pads 23 formed on the uppermost portion of the thin film circuit of the thick and the thin film hybrid multilayer wiring substrate are connected to the LSI 30 by solder so that the module is completed.

Embodiment 6

One adjustment layer is formed on a five-layer thick film wiring substrate having a size of 100 mm square and a four-layer thin film circuit is further formed on the adjustment layer in the same manner as in the embodiment 1. The fabricating method of the substrate is the same as in the embodiment 1 except the method of detecting the position aligning marks on the surface of the thick film wiring substrate. That is, the thick film substrate is set on a second-dimensional coordinate measuring base and coordinates of the position aligning marks are automatically detected from a pattern on a TV monitor through an optical microscope. The method in which the coordinates of the position aligning mark are supplied to a computer and the connecting conductor pad of the adjustment layer is formed on the basis of the coordinates of the position aligning mark is the same as in the embodiment 1.

Embodiment 7

One adjustment layer is formed on a five-layer thick film wiring substrate having a size of 70 mm square and a four-layer thin film circuit is further formed on the adjustment layer in the same manner as in the embodiment 3. The fabricating method of the substrate is the same as in the embodiment 3 except the method of detecting the position aligning marks on the surface of the thick film wiring substrate and a method of forming the connecting conductor pad of the adjustment layer. That is, in order to detect the position aligning mark on the surface of the thick film wiring substrate, in the same manner as in the embodiment 6, the thick film substrate is set on a second-dimensional coordinate measuring base and coordinates of the position aligning marks are automatically detected from a pattern on a TV monitor through an optical microscope. The method in which the coordinates of the position aligning mark are supplied to a computer and the connecting conductor pad of the adjustment layer is formed on the basis of the coordinates of the position aligning mark is the same as in the embodiment 1. Further, the connecting conductor pad of the adjustment layer is formed by the thick film printing method using a dot printer. Silver/palladium is used as conductor material and the shape of the conductor pad is elliptical in the same manner as that of the embodiment 3 with the maximum width being 500 μm.

Embodiment 8

Figure 10:
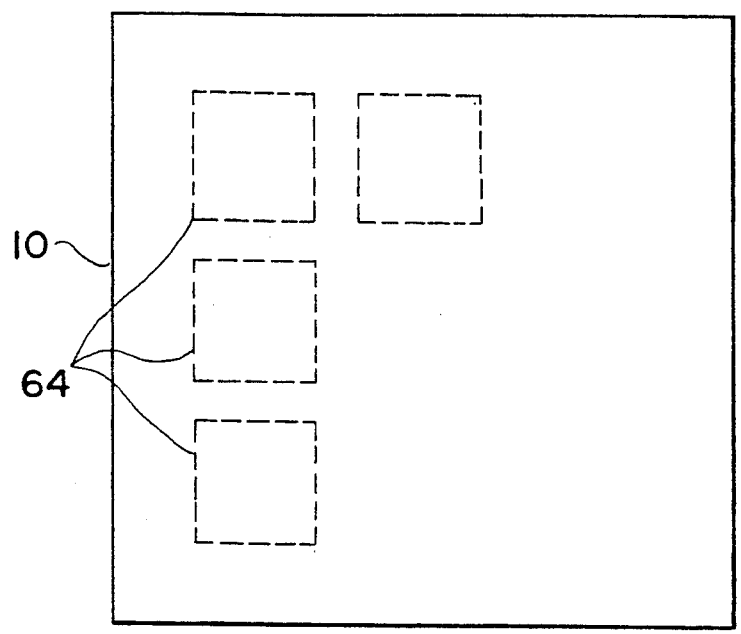

FIG. 10 shows another embodiment according to the present invention. The thick and thin film multilayer wiring substrate 10 is 100×100 mm² in size and via portions 13 each having a diameter of 50 μm are formed in the substrate at a design pitch of 150 μm. LSI chips are spaced from one another on the substrate 10 as shown by 64 of FIG. 10. Accordingly, in the embodiment, the mounting positions of the LSI chips are set to correspond to the divided blocks as described above and the substrate is divided as shown by 64.

With such a configuration, formation of the connecting pattern for via portions existing outside of the blocks unnecessary for wiring can be avoided and formation of connecting pattern for correction can be easily made.

Figure 11:
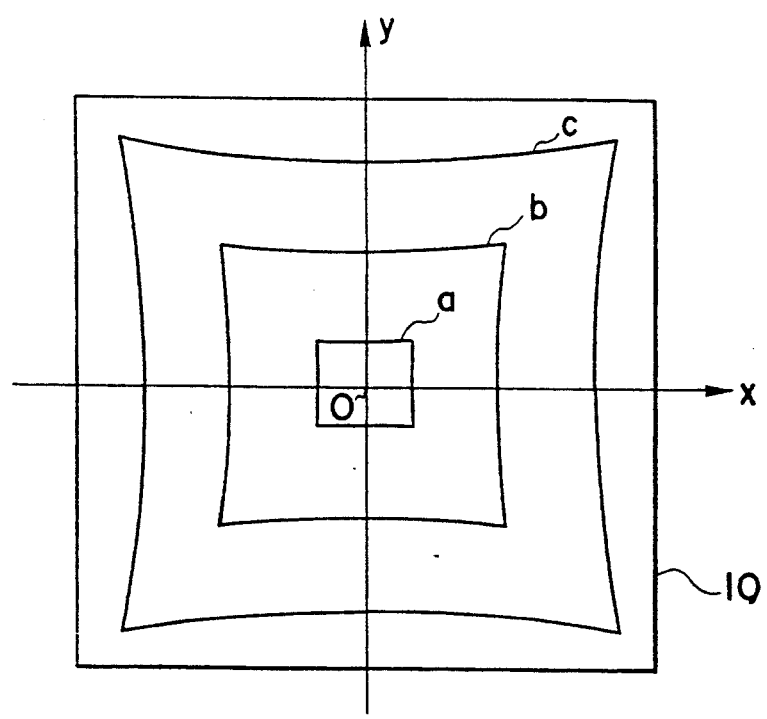

FIG. 11 is a diagram for explaining another embodiment of the present invention. Deviations of the via portions formed on the substrate 10 shown in FIG. 8 from the standard positions thereof were measured. It has been found that the deviations have a regularity having a center O of the substrate 10 as an origin as shown by deviation contour lines a, b and c of FIG. 11.

Accordingly, an x-y coordinate system having the center of the substrate as the origin is considered and a length L of the connecting pattern is determined by the equation expressed by $$\Delta x_{ij} = ax_{ij} + by_{ij} + cx_{ij}^2 + dy_{ij}^2 + e$$

$$\Delta y_{ij} = fx_{ij} + gy_{ij} + hx_{ij}^2 + ky_{ij}^2 + m$$

$$L = (\Delta x_{ij}^2 + \Delta y_{ij}^2)^{0.5}$$

(where i and j represent a position of a (i, j)th via portion on the basis of the center of the substrate) Coefficients a to m were obtained by approximating the deviation shown in FIG. 11 by the least squares method.

With the above system, the length L of the connecting pattern can be determined analytically and the pattern forming process can be simplified.

When the deviation of the via portions from the reference position is dependent on a distance from the center 0 of the substrate as shown in FIG. 11, the substrate may be divided into a plurality of blocks 63 as shown in FIG. 8 and each of the blocks may be divided into smaller sub-blocks (not shown).

With such a multiple division, correction depending on positions is made for each sub-block and drawing can be made using a fixed correction amount in the same sub-blocks so that the process of forming the connecting pattern can be performed simply in a short time.

Figure 12:
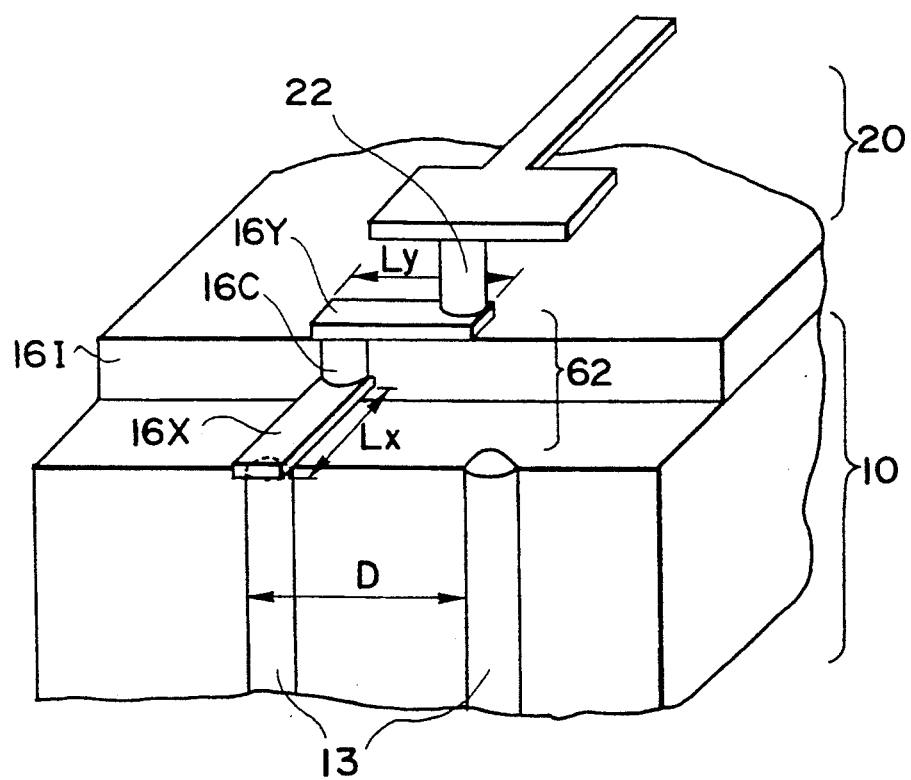
FIGS. 12 and 13 are diagrams explaining other examples of a pattern adjusting method according to the present invention, respectively.

FIG. 12 shows an embodiment in which an adjustment layer 62 is provided to make correction. In the embodiment, since positional deviation between a via portion 13 and a wiring conductor 22 is large, wiring for adjustment is divided into two upper and lower layers of an X-directional pattern 16x and a Y-directional pattern 16y. Numeral 16c denotes a connecting conductor between the two layers and numeral 16I denotes an insulation layer. The wiring conductor 22 is provided on the adjustment layer of the two layers to make connection with the LSI chip. When lengths Lx and Ly of the connecting patterns in the adjustment layer of the two layers are further longer, the adjustment layer may be formed of more multiple layers so that the length of the patterns in each of the layers is equal to or smaller than a pitch D of the via portions.

In the above embodiment, in order to correct distortion of the thick film wiring substrate 10, the adjustment pattern 16 shown in FIG. 1 or the adjustment layer 62 shown FIG. 12 is provided to make correction, while drawing data of the wiring layer in the thin film wiring substrate 20 can be changed so that distortion in the thick film wiring substrate 10 can be corrected to make adjustment connection. The positions of the via portions on the thick film wiring substrate 10 are measured by any method described later and the positional data of the wiring layer in the thin film wiring substrate 20 is changed to coincide with the measured data. Change of the drawing data is made for the pattern data such as power wiring, signal wiring, metal pad or the like in the thin film wiring layer. For example, distortion of the thick film wiring substrate 10 is measured to be divided into components in the X and Y directions and data of the position of the wiring conductor 22 is changed by a distance corresponding to Lx and Ly to thereafter form a pattern of the wiring conductor 22. At the same time, data of other connecting wiring layers in the thin film wiring substrate 20 connected thereto is also changed by a distance correspondingly. At this time, it is important that the magnitude of change data is made smaller than a pitch D of the via portions so that adjacent wirings having a minimum distance therebetween is not brought into contact with each other.

Embodiment 9

Figure 13:
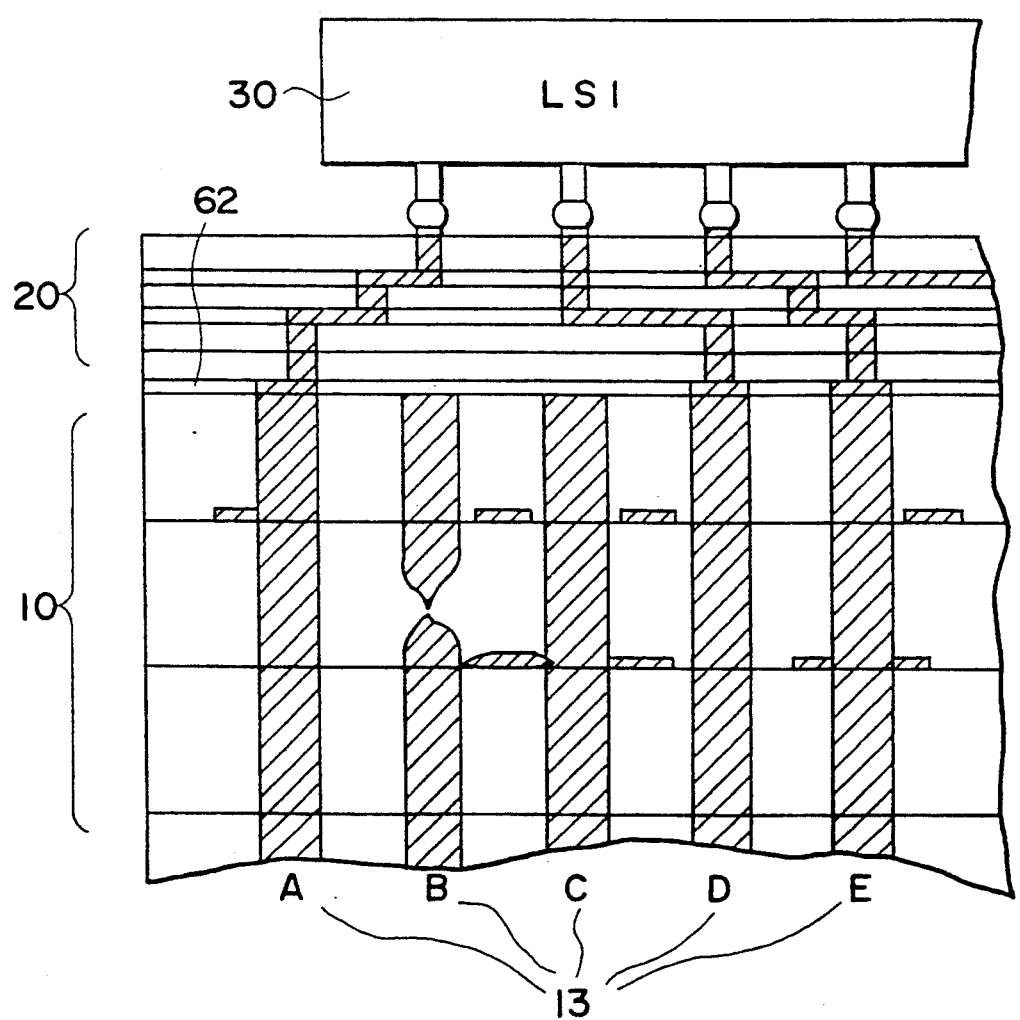

Countermeasure of disconnection or short circuit in the via portion is now described. Disconnection of the via portion or short circuit of the via portion with other portions in the thick film wiring substrate 10 is detected by any method described later. The drawing data of the wiring layer in the thin film wiring substrate 20 is changed to avoid utilization of the disconnected via portion or the short-circuited via portion so that the exactly operated thick and thin film hybrid multilayer wiring substrate can be fabricated even if there is a defect in the thick film wiring substrate 10. FIG. 13 shows an example thereof. It was detected that a via portion B of via portions A, B, C, D and E provided in a thick film wiring substrate 10 is disconnected and the via portion C is short-circuited with the via portion B. Thus, connection of the via portions B and C with wiring in the thin film wiring substrate is prevented and the via portions A and D existing near the via portions B and C are used instead as shown in FIG. 13. Accordingly, the drawing data is changed so that the connecting data is changed as shown in FIG. 13.

In the embodiment, the existing drawing data based on the existing design data of the thin film wiring substrate is changed so that the connection position is corrected or modified, while a novel modification layer for producing a connection pattern for connection adjustment or modification can be provided instead of modification of the existing drawing data.

Further, the function of the modification of the drawing data or the pattern modification by the modification layer can be provided in the adjustment layer 62 described in the embodiments of FIGS. 1 and 12.

In the foregoing description, the modification is made on the basis of the result of the defect inspection for the thick film wiring substrate 10, while the inspection of disconnection and short circuit is performed before the LSI is connected finally, that is, after the thin film wiring substrate 20 is formed on the thick film wiring substrate 10. The drawing data may be modified on the basis of the result of the inspection and connection with the LSI 30 may be made through a modification pattern (modification layer).

Embodiment 10

An energy beam used as the pattern forming means is now described. The pattern forming means of the pattern forming apparatus described above can use an electron beam, an optical beam or an ion beam. The pattern forming apparatuses comprise means for making small the beam and deflection means for deflecting the small beam toward any position of a sample. A very fine pattern having, for example, a width of line of about 10 nm for the electron beam, about 100 nm for the optical beam or about several tens nm for the ion beam can be formed by both the means.

Further, it is a matter of course that the above-mentioned dimension measuring means can use the electron beam, the ion beam and the optical beam and the dimension measuring means includes the converging means and the deflection means.

Figure 14:
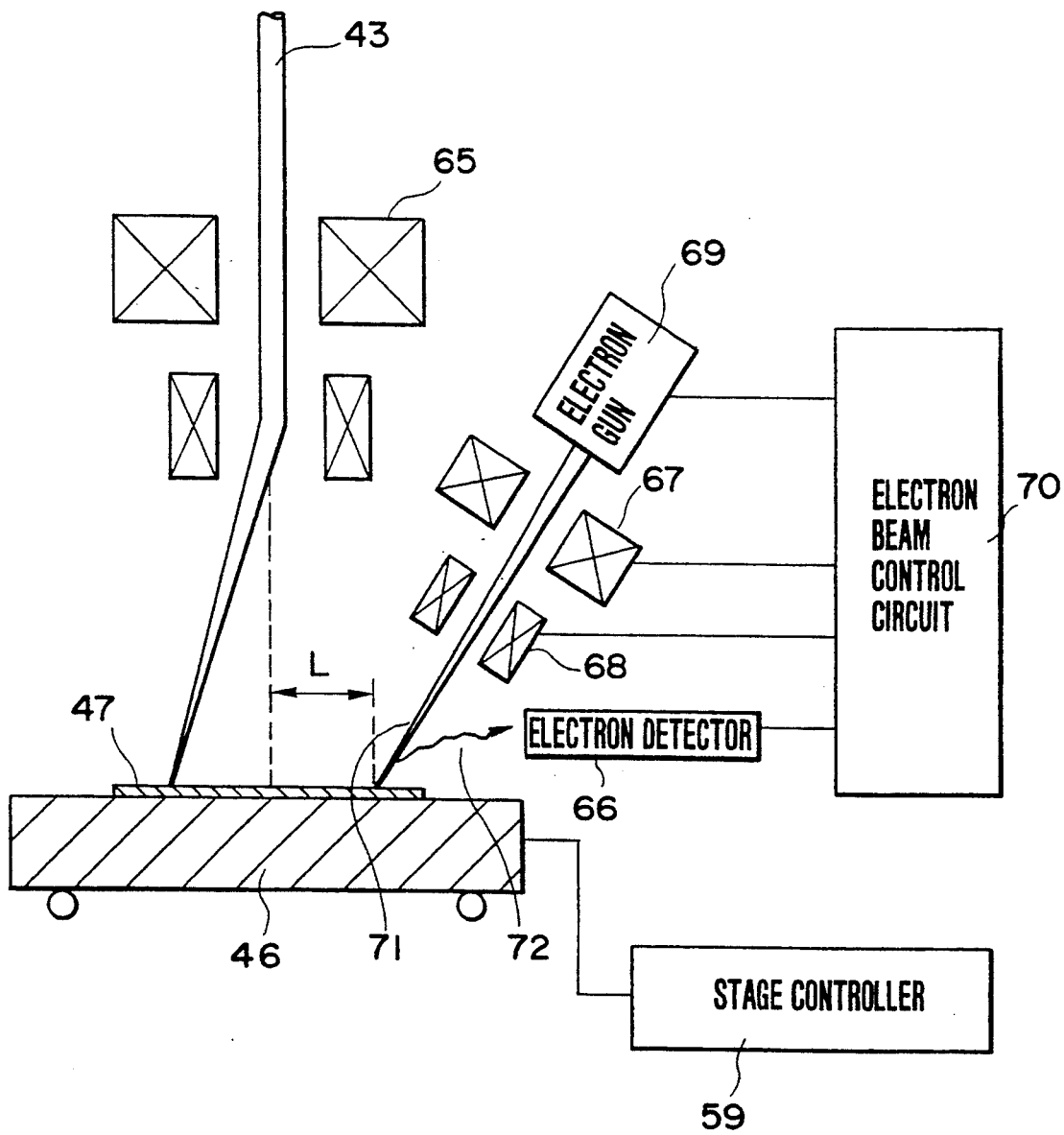
FIGS. 14, 15, 16, 17 and 18 are diagrams explaining other examples of partial configuration of pattern fabricating apparatuses according to the present invention, respectively.

In the foregoing, the pattern formation and the position measurement are made using the same electron beam, while a special electron beam for measurement may be provided. This embodiment is shown in FIG. 14. An electron beam mirror body for measurement is disposed at the side of an electron beam mirror body for pattern formation (in the figure, only a converging lens 65 and a deflector 45 are shown). The measuring electron beam mirror body comprises a measuring electron gun 69, a measuring converging lens 67, a measuring deflection coil 68, and a secondary electron detector 66 for detecting secondary electrons. Positions of optical axes of the pattern forming electron beam mirror body and the measuring electron beam mirror body are separated from each other by a fixed distance (L) on the sample substrate 47, while the value can be corrected by measuring it in advance. The merits of this system reside in that: ① a pattern forming electron beam 43 and a measuring electron beam 71 can be set to separate electron energy, ② a special electron optical system can be used for the measuring electron beam system to obtain an electron beam having a very small diameter as compared with that of the pattern forming electron beam system, and ③ time is shortened since the position can be measured by a measuring electron beam control circuit 70 simultaneously with the pattern formation. In the description, the electron beam is used for the measurement, while other beam, for example, optical beam or ion beam may be used as described above.

The position of the sample (substrate) 47 to be measured is measured precisely by a laser interferometer or the like and the sample 47 is placed on a stage 46 of which the position is controlled by a stage control system 59 with high reproducibility. The existing pattern on the substrate is measured precisely on the basis of movement of the stage 46 and a detection signal of a secondary electron (reflected electron may be used) obtained by scanning of the measuring electron beam 71. The measuring method will be described later.

Figure 15:
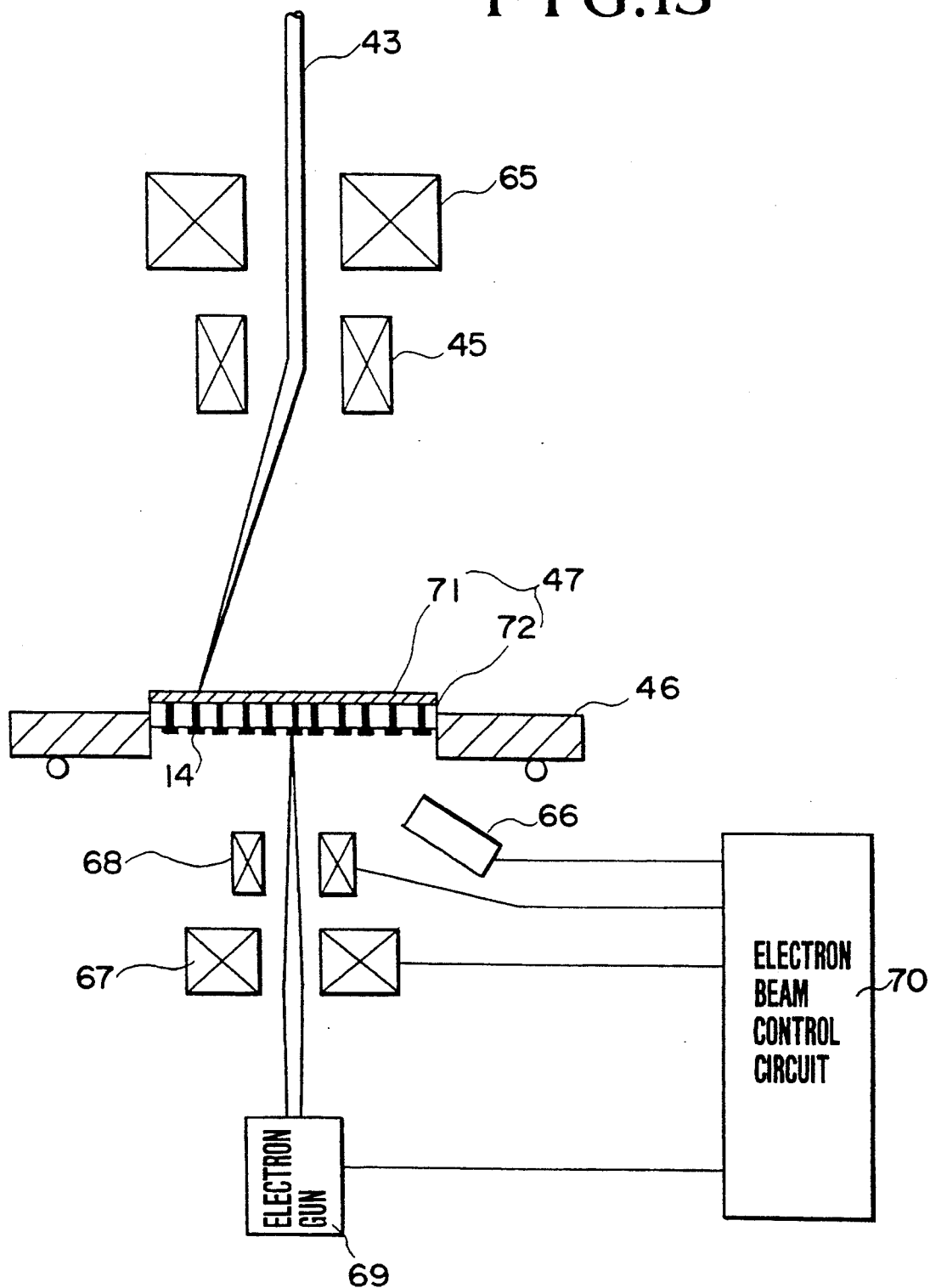

When the existing pattern on the sample (substrate) 47 is a pattern in which pattern images on both sides are matched such as through holes, measurement of dimension of the pattern can be made from the rear surface of the substrate. FIG. 15 shows an embodiment in which the pattern dimension measurement is made from the rear surface. The constituent elements thereof are the same as those of FIG. 14 and main elements are designated by like numerals. In addition to the merits described in FIG. 14, the merit of this system resides in that even if resist 71 is applied thick on the existing pattern on the substrate 72, the dimension can be measured by irradiating lands 14 on the rear surface with a beam.

In the pattern formation of the present invention, the electron beam or the like is used to form a new pattern on the existing pattern, while when disconnection or short circuit between wirings exist in wirings of the existing pattern, it is useless to form a new pattern on the existing pattern. Namely, the yield in the final stage is reduced. Thus, if a bad portion is avoided to form a new pattern, the yield can be increased. The apparatus of the present invention has a function of detecting a bad portion and can form a pattern in which the bad portion is avoided. In order to detect the bad portion, there are considered three methods: 1) the electron beam for the pattern formation is used, 2) an electron beam apparatus dedicated to inspection is provided, and 3) the electron beam apparatus dedicated to inspection is provided on the side of the rear surface. In the methods 2) and 3), the electron beam apparatus for dimension measurement can be used.

Figure 16:
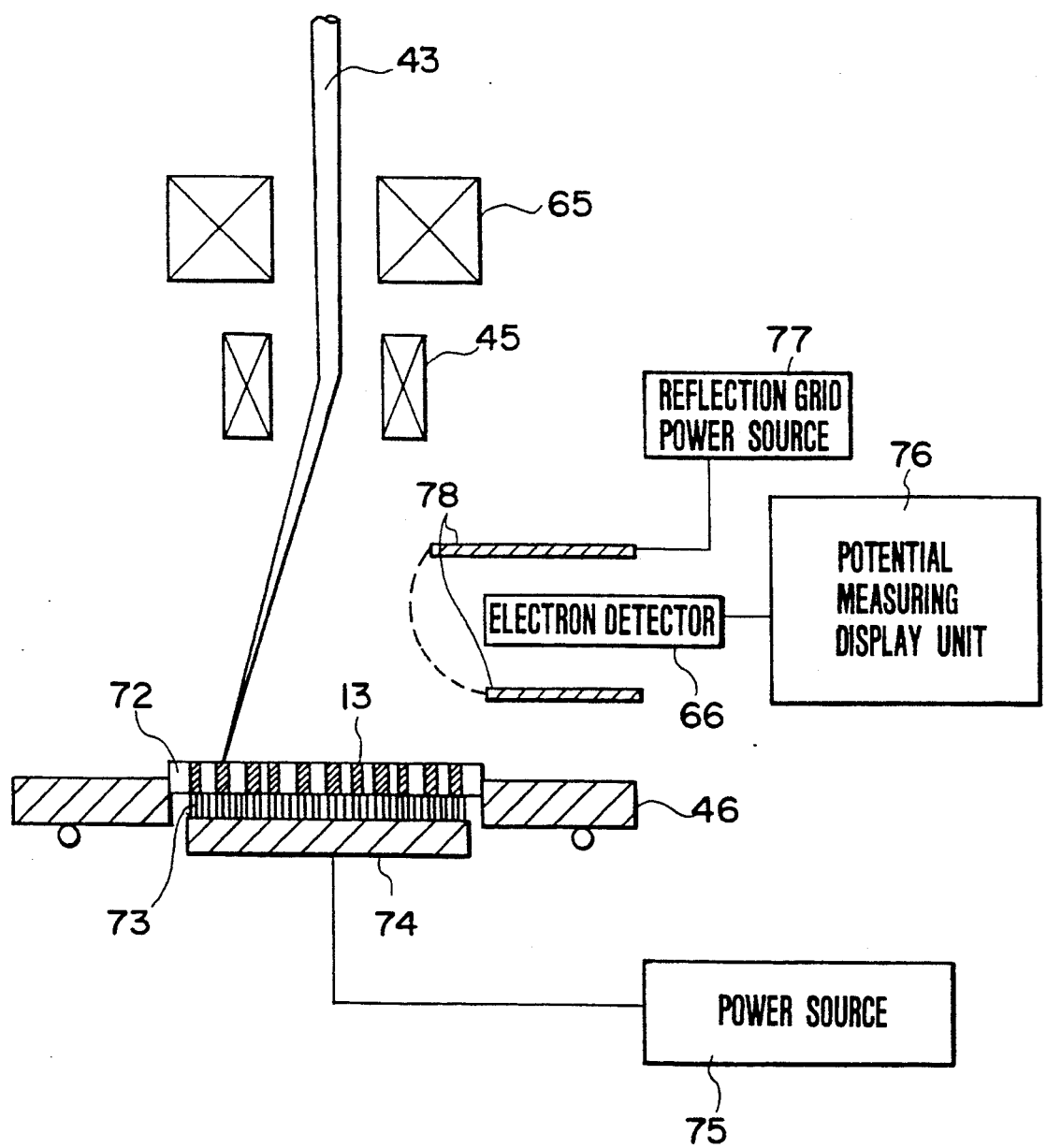

FIG. 16 shows an embodiment in which the electron beam for the pattern formation is used for inspection. A potential of a potential supply power source 75 is applied to via portions 13 in a substrate through a brush 73 and an electrode 74 from a lower surface side of a sample substrate 72 placed on a stage 46. The applied potential may be dc or ac. When it is ac, detection of synchronization can be made.

The bad portion is detected as follows. The substrate 72 is scanned by a pattern forming electron beam 43 through a converging lens 65 and a deflector 45 and a potential measuring display unit 76 is used to form a secondary electron scanning image. When the sample applied with the potential is observed by the secondary electron image, the contrast appears. This is a phenomenon known well as the potential contrast. When the potential is applied from the rear surface, the potential distribution appeared on the upper surface of the substrate 72 is understood from the design specification of the wiring in the substrate. Thus, a location of disconnection or short circuit in the substrate can be detected on the basis of an expected signal waveform and an observed signal waveform. As shown in FIG. 16, a reflection grid 78 is disposed before a secondary electron detector 66 and a negative potential is applied to the reflection grid 78 from a reflection grid power source 77 so that the potential contrast of the secondary electron image can be enhanced.

Figure 17:
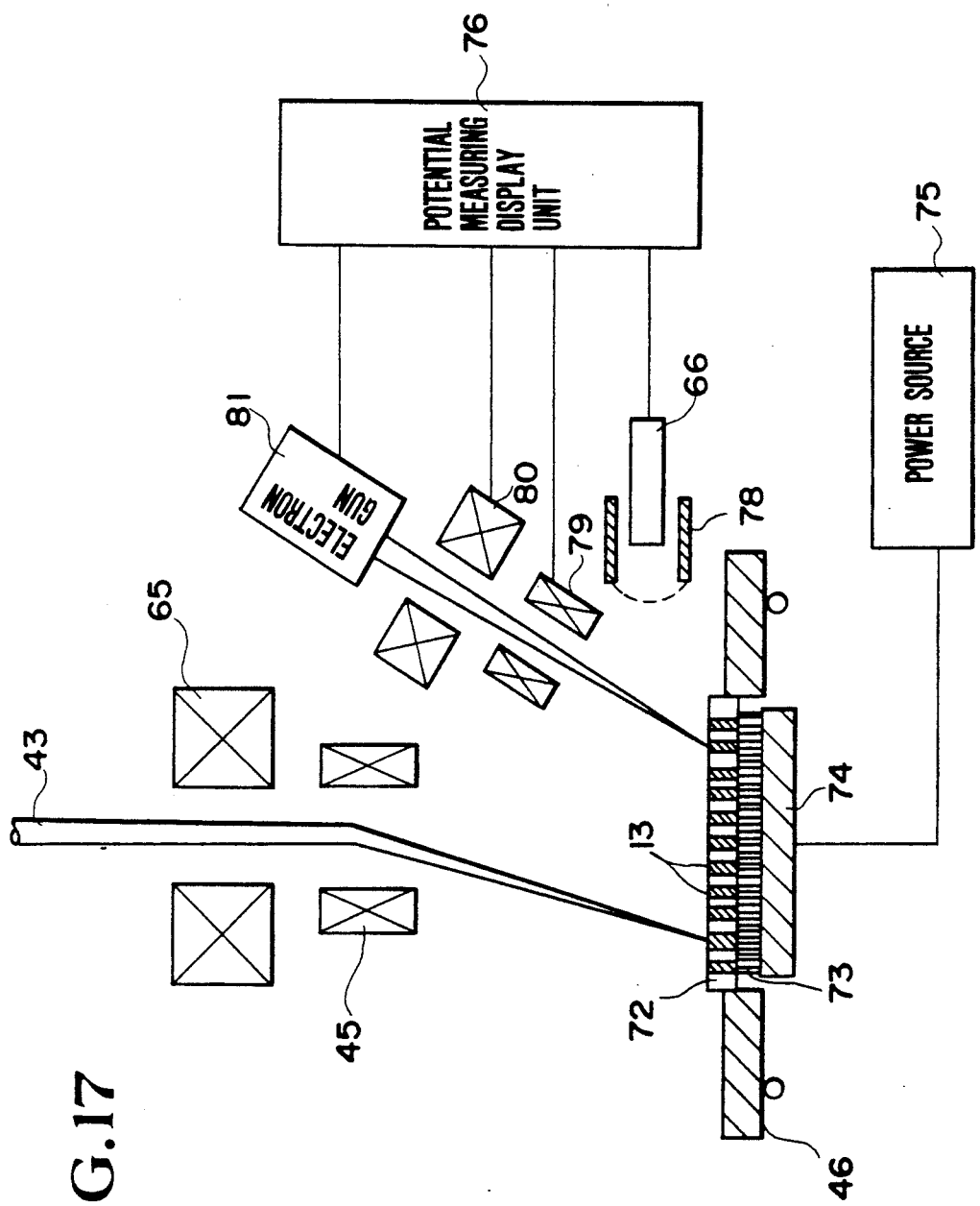

In the embodiment, the electron beam for pattern formation is used for the electron beam for inspection, while an electron beam apparatus dedicated to the inspection can be provided as described above. FIG. 17 shows an embodiment in which the electron beam apparatus for inspection is provided on the side of the upper surface of the substrate. The electron beam apparatus for inspection has an electron optical system for inspection including an electron gun for inspection 81, a converging lens for inspection 80 and a deflection coil 79 for inspection. The electron beam apparatus for inspection can use the electron beam apparatus for dimension measurement effectively. In this case, the reflection grid 78 is disposed before the secondary electron detector 66. Thus, a positive potential is applied to the reflection grid 78 in the case of the dimension measurement, while a negative potential is applied thereto in the case of the inspection. Further, since the substrate 72 to be measured is mainly made of insulator such as ceramics, it is necessary to use an electron beam having low energy of 1 kV or less in order to avoid charging to the surface of the insulator even in the case of the inspection. The inspection method is the same as in FIG. 16 and main elements are designated by like numerals.

Embodiment 11

Figure 18:
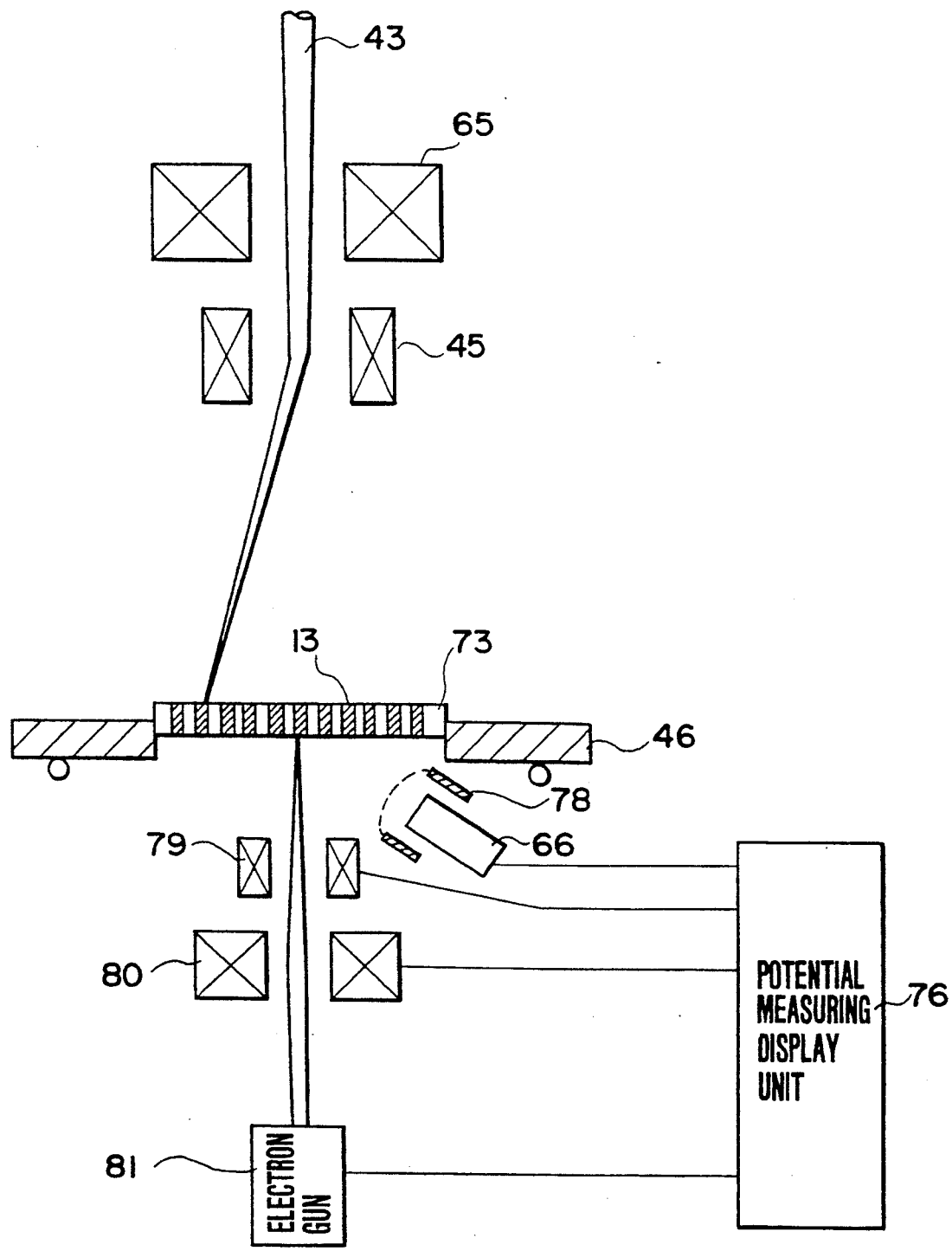

FIG. 18 shows an embodiment in which the inspection is made from the rear surface of the substrate. In this case, the electron beam apparatus for dimension measurement shown in FIG. 15 can be also used. The reflection grid 78 is also provided before the secondary electron detector 66 to enhance potential contrast. When the inspection is made from the rear surface of the substrate, the electron beam 43 for pattern formation is used as means for applying a potential to the via portions 13. The substrate 73 is first scanned by the electron beam 43 for pattern formation. When energy of the electron beam 43 for pattern formation is 1 kV or more, the via portions 13 which is insulated from others by irradiation of electron are charged to a negative potential. The subsequent detection method is the same as in FIGS. 16 and 17 and main elements are designated by like numerals of FIGS. 16 and 17 except that the substrate and the via portions are designated by 73 and 13, respectively. In this manner, the inspection of disconnection and short circuit can be made by the electron beam apparatus for inspection provided in the rear surface.

Figure 19:
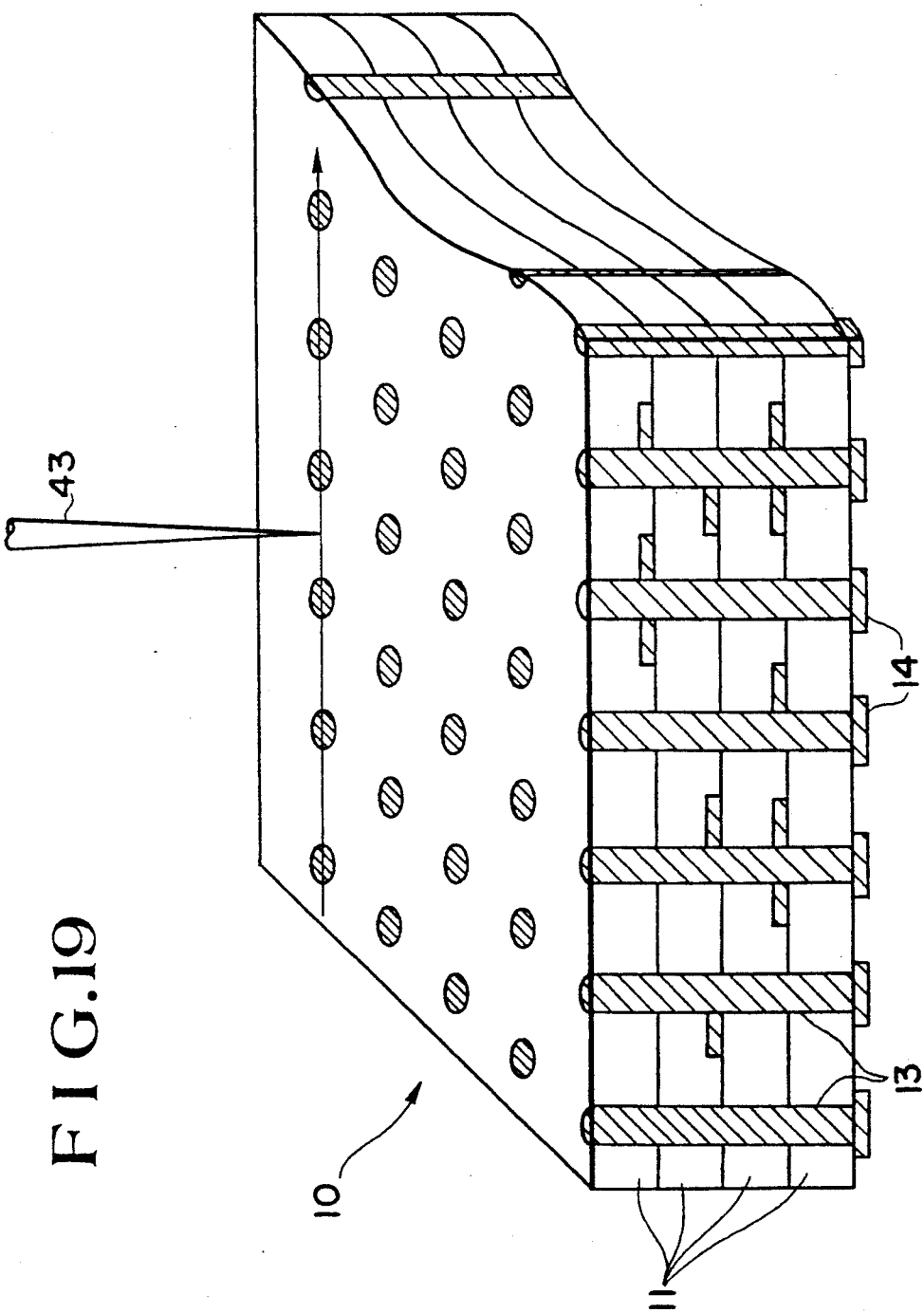

There are some different kinds of methods of measuring coordinates of a position of a via portion used as a reference mark and formed in the surface of the thick film wiring substrate by using the above described position coordinate measuring apparatus. Description is now made thereto. FIG. 19 is a sectional view of the thick film wiring substrate 10 made of alumina insulation layers 11. The substrate is scanned by a converged electron beam from the upper part as shown in FIG. 19 and secondary electrons generated are detected to measure coordinates of the position of the via portion 13. A land 14 is formed at the end of the via portion 13. The secondary electron signal has the generation efficiency which is different depending on a shape and material of the sample and accordingly the signal has waveforms as shown in FIGS. 20A-20D. When the electron beam is focused, the signal has a waveform as shown in FIG. 20B. If each of peak values thereof is detected, the coordinates of the central position of each of the via portions 13 can be automatically determined on the basis of the relative relation between the peak values and the scanning area (FIG. 20A) of the electron beam. In this manner, the coordinates of the positions of all of the via portions can be measured with high accuracy. When the secondary electron signal is detected while the lens convergence condition of the final stage of the electron beam is set in the defocused state, the signal has a waveform as shown in FIG. 20C. When any slice level is set in this waveform and the signal is converted into a pulse waveform having 1/0, the signal is as shown in FIG. 20D and the presence and positions of the via portions can be easily determined by this pulse signal. Under this condition, the scanning by the electron beam can be roughed second-dimensionally so that the measuring time can be shortened. In order to further shorten the measuring time, it is apparent that even if several measurement points selected specially are measured, the whole tendency of distortion in the thick film wiring substrate can be measured.

Figure 21:
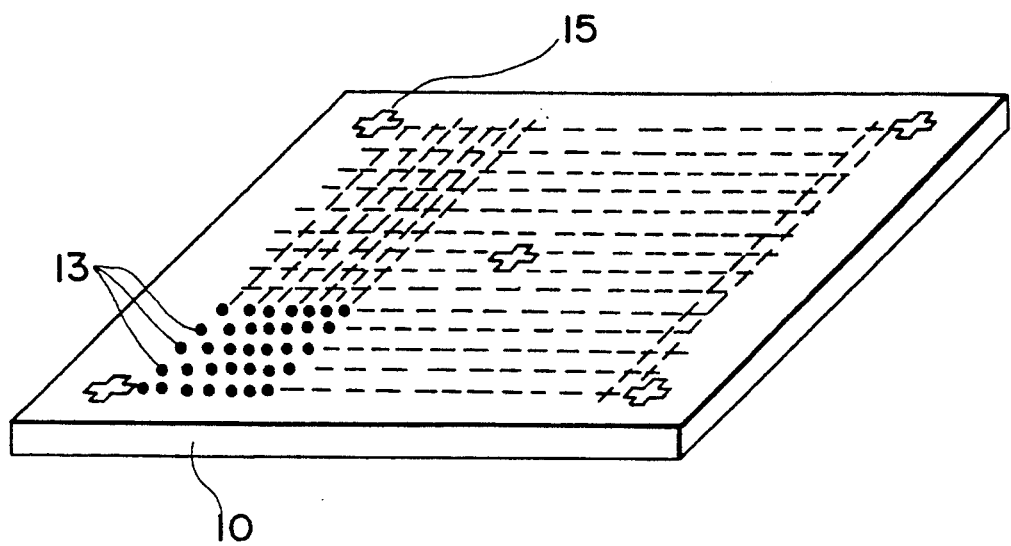
Figure 22A:
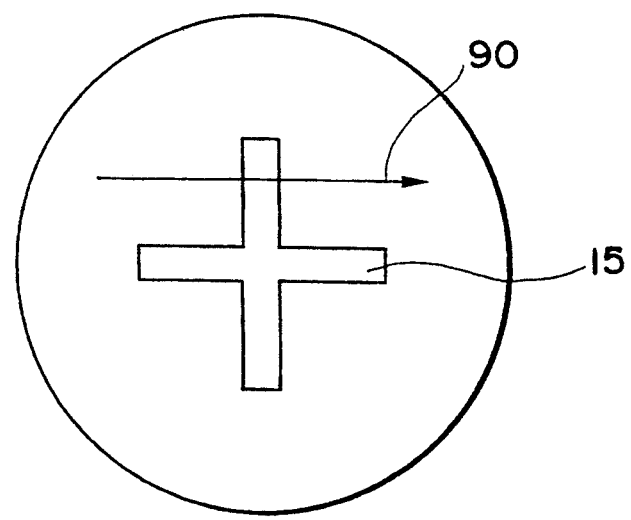
Figure 22B:

Further, as shown in FIG. 21, even when a plurality of via portions and reference marks 15 are provided on the thick film wiring substrate 10 and the reference marks are measured, the object can be achieved. By way of example, a cross mark is used as the reference mark. FIGS. 22A and 22B show a relation between the scanning (scanning direction 90) by electron beam and a waveform of the secondary electron signal. The coordinates of the central position of the mark can be measured on the basis of the waveform of the secondary electron signal of FIG. 22B obtained corresponding to the electron beam scanning of FIG. 22A in the same manner as above.

The pattern forming method of the present invention possesses the following effects.

First, even if the shrinkage of the ceramic or glass ceramic substrate is dispersed, the connecting conductor pattern can be made in consideration of the connection position with the thin film circuit formed thereon to prevent bad connection between the ceramic or glass ceramic circuit and the thin film circuit formed thereon.

Second, the connecting conductor pattern, which was formed into a circle having a diameter of 1000 $\mu$m heretofore, is formed into a band having a horizontal width of 50 to 500 $\mu$m so that high densification of the conductor wirings in the substrate and the modules such as LSI's on the substrate can be performed.

What is claimed is:

1. A method of fabricating a pattern in a multilayer wiring substrate having a thick film and a thin film, the thin film having a regular pattern, the method comprising the steps of:
    measuring a position of an existing pattern formed on the thick film;
    forming a connection pattern based on the results of the measuring step; and,
    positioning the connection pattern in relation to the existing pattern, such that the existing pattern coincides with the regular pattern.

2. The method of claim 1 wherein the existing pattern is formed in the thin film and the regular pattern is formed in the thick film.

3. The method of claim 1 wherein the positioning step further includes placing the connection pattern between the existing pattern and the regular pattern.

4. A method according to claim 1, wherein the regular pattern is an LSI.

5. A method according to claim 1, wherein the connection pattern is provided in the thin film of the thick and thin film multilayer wiring substrate.

6. A method according to claim 1, wherein the pattern includes any one of the existing pattern, the regular pattern and the connection pattern.

7. A method according to claim 1, wherein blocks, which are formed from a substrate are prepared by division of the substrate and the connection pattern is formed for each block.

8. A method according to claim 7, wherein each of the blocks is formed by division of the substrate so that a length of the pattern is smaller than a minimum pattern interval.

9. A method according to claim 7, wherein the blocks are formed for each LSI.

10. A method according to claim 1, wherein a connecting pattern length L is determined by the square root of $\Delta X_{ij}$ and $\Delta Y_{ij}$, where $\Delta X_{ij}$ and $\Delta Y_{ij}$ are expressed by at least a first-order term and a second-order term of X and Y coordinates.

11. A method according to claim 1, wherein sub-blocks which are formed form a substrate are prepared by division of the substrate to be smaller than a minimum pattern interval and the connection pattern is formed with a fixed value in the sub-block.

12. A method according to claim 1, wherein the connection pattern is formed in an adjustment layer provided in the thin film.

13. A method according to claim 12, wherein said adjustment layer is a single layer.

14. A method according to claim 12, wherein said adjustment layer comprises two layers and the pattern is formed in only one direction of two orthogonal directions in each of said layers.

15. A method according to claim 12, wherein said adjustment layer comprises a plurality of layers and the pattern is formed to be smaller than a minimum pattern interval in each of said layers.

16. A method according to claim 1, wherein the connection pattern is formed using a wiring layer and a power layer in the thin film.

17. A method according to claim 16, wherein the connection pattern is formed in a longitudinal direction of the pattern.

18. A method according to claim 16, wherein the connection pattern is formed to be smaller than a minimum pattern interval.

19. A method according to claim 1, wherein the pattern is formed on the basis of a measuring process of failure including disconnection and short circuit in wiring of the thick and thin film multilayer wiring substrate.

20. A method according to claim 19, wherein the pattern is formed in a modification layer provided in a thin film.

21. A method according to claim 20, wherein the connection pattern is formed in an adjustment layer.

22. A method according to claim 20, wherein the connection pattern is formed in a final layer in a thin film.

23. A method according to claim 1, wherein said step of measuring a position is made by an electron beam.

24. A method according to claim 1, wherein said step of measuring a position is made by an optical beam.

25. A method according to claim 1, wherein said step of measuring a position is made by an ion beam.

26. A method according to claim 23, comprising a step of making the beam small and deflecting the beam on a sample.

27. A method according to claim 26, wherein a pattern forming surface and a position measuring surface of sample correspond to both surfaces of the sample.

28. A method according to claim 19, wherein the measuring process of failure including disconnection and short circuit in wiring uses any of the position measuring means.

29. A method according to claim 19, wherein the measuring process of failure including disconnection and short circuit in wiring comprises at least a step of applying a potential or a potential variation to the wiring and a step of measuring the potential or the potential variation.

30. A method according to claim 1, wherein said step of measuring a position performs all required pattern measurement prior to pattern formation.

31. A method according to claim 1, wherein said step of measuring a position includes successively performing measurements for formation of each pattern.

32. A method according to claim 1, wherein said step of measuring a position comprises measuring positions of all existing patterns.

33. A method according to claim 1, wherein said step of measuring a position comprises sampling a plurality of positions of existing patterns and measuring the plurality of positions.

34. A method according to claim 1, wherein said step of measuring a position comprises providing a plurality of reference marks separately from the existing pattern and measuring positions of the reference marks.

35. A method according to claim 1, wherein said step of measuring a position comprises dividing all areas of a formation pattern into pixels smaller than a minimum pattern and measuring the position in accordance with presence of pattern.

36. A method according to claim 24, comprising steps of making the beam small and deflecting the beam on a sample.

37. A method according to claim 25, comprising steps of making the beam small and deflecting the beam on a sample.

* * * * *